(12) United States Patent
Hisada et al.

(10) Patent No.: US 8,952,551 B2
(45) Date of Patent: Feb. 10, 2015

(54) SEMICONDUCTOR PACKAGE AND METHOD FOR FABRICATING THE SAME

(75) Inventors: Takashi Hisada, Hachiouji (JP); Katsuyuki Yonehara, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 13/436,039

(22) Filed: Mar. 30, 2012

(65) Prior Publication Data

US 2012/0187562 A1    Jul. 26, 2012

Related U.S. Application Data

(62) Division of application No. 12/054,156, filed on Mar. 24, 2008, now abandoned.

(30) Foreign Application Priority Data

Mar. 26, 2007    (JP) .................................. 2007-78810

(51) Int. Cl.
*H01L 23/48*    (2006.01)
*H01L 23/00*    (2006.01)
(Continued)

(52) U.S. Cl.
CPC .......... *H01L 23/49833* (2013.01); *H01L 24/73* (2013.01); *H01L 2224/92247* (2013.01); *H01L 2924/01079* (2013.01); *H01L 23/3128* (2013.01); *H01L 23/49822* (2013.01); *H01L 2924/01045* (2013.01); *H01L 2224/29111* (2013.01); *H01L 2924/014* (2013.01); *H01L 2924/0001* (2013.01);
(Continued)

(58) Field of Classification Search
USPC .......... 257/678, 680, 700, 730, E21.499, 664, 257/665, 666, 673, 676, 690, 734, 748, 781, 257/E23.001, E23.01, E23.035, E23.49, 257/E23.054, E23.056
See application file for complete search history.

(56) References Cited

U.S. PATENT DOCUMENTS 3,013,192 A    12/1961    Starr
5,145,104 A    9/1992    Apap et al.
(Continued)

FOREIGN PATENT DOCUMENTS

JP    02-130946    *    5/1990    .............. H01L 23/02
JP    02130946        5/1990
(Continued)

*Primary Examiner* — Galina Yushina
(74) *Attorney, Agent, or Firm* — Yee & Associates, P.C.; Steven L. Bennett

(57) ABSTRACT

A semiconductor package includes a wiring substrate, a semiconductor chip, and a conductor plate in order to reduce a voltage drop at the central portion of a chip caused by wiring resistance from a peripheral connection pad disposed on the periphery of the chip. Central electrode pads for use in ground/power-supply are disposed on the central portion of the chip. The conductor plate for use in ground/power-supply is disposed on the chip such that an insulating layer is disposed therebetween. The central electrode pads on the chip and the conductor plate are connected together by wire bonding through an opening formed in the insulating layer and the conductor plate. An extraction portion of the conductor plate is connected to a power-supply wiring pad on the wiring substrate. Preferably, the conductor plate is composed of a multilayer structure, and each conductor plate is used in power-supply wiring or ground wiring.

11 Claims, 13 Drawing Sheets

(51) Int. Cl.
*H01L 23/495* (2006.01)
*H01L 23/31* (2006.01)
*H01L 23/498* (2006.01)

(52) U.S. Cl.
CPC . *H01L 2224/48247* (2013.01); *H01L 23/49811*
(2013.01); *H01L 2224/48644* (2013.01); *H01L*
*2224/29101* (2013.01); *H01L 2924/30107*
(2013.01); *H01L 2924/0665* (2013.01); *H01L*
*2924/01074* (2013.01); *H01L 24/49* (2013.01);
*H01L 24/06* (2013.01); *H01L 2924/01077*
(2013.01); *H01L 2224/05555* (2013.01); *H01L*
*24/84* (2013.01); *H01L 2224/48227* (2013.01);
*H01L 2924/1517* (2013.01); *H01L 2924/01004*
(2013.01); *H01L 2224/2919* (2013.01); *H01L*
*24/36* (2013.01); *H01L 2924/00013* (2013.01);
*H01L 2224/48465* (2013.01); *H01L 24/29*
(2013.01); *H01L 2224/84203* (2013.01); *H01L*
*2224/05644* (2013.01); *H01L 2924/01028*
(2013.01); *H01L 2924/01006* (2013.01); *H01L*
*2224/05556* (2013.01); *H01L 2224/49171*
(2013.01); *H01L 24/32* (2013.01); *H01L*
*2224/32245* (2013.01); *H01L 24/39* (2013.01);
*H01L 2924/19041* (2013.01); *H01L 24/83*
(2013.01); *H01L 2224/73215* (2013.01); *H01L*
*2924/01078* (2013.01); *H01L 2924/01046*
(2013.01); *H01L 2224/85191* (2013.01); *H01L*
*2924/0781* (2013.01); *H01L 2224/29298*
(2013.01); *H01L 2224/04042* (2013.01); *H01L*
*2924/0105* (2013.01); *H01L 24/34* (2013.01);
*H01L 24/48* (2013.01); *H01L 2224/48091*
(2013.01); *H01L 2224/45144* (2013.01); *H01L*
*2924/0132* (2013.01); *H01L 2224/4826*
(2013.01); *H01L 2924/01029* (2013.01); *H01L*
*2224/73265* (2013.01); *H01L 2224/73221*
(2013.01); *H01L 2224/0401* (2013.01); *H01L*
*2224/32225* (2013.01); *H01L 2224/83191*
(2013.01); *H01L 24/91* (2013.01); *H01L 24/41*
(2013.01); *H01L 2224/838* (2013.01); *H01L*
*24/45* (2013.01); *H01L 2924/01082* (2013.01);
*H01L 2924/01005* (2013.01); *H01L 2224/06136*
(2013.01); *H01L 2924/14* (2013.01); *H01L*
*2924/01033* (2013.01); *H01L 2924/15311*
(2013.01); *H01L 24/40* (2013.01); *H01L 24/05*
(2013.01); *H01L 2924/01047* (2013.01)
USPC .......... 257/781; 257/685; 257/668; 257/676;
257/E23.069; 257/E23.039

(56) References Cited

U.S. PATENT DOCUMENTS

| | | | |
|---|---|---|---|
| 5,461,255 A * | 10/1995 | Chan et al. | 257/672 |
| 5,480,841 A | 1/1996 | Bickford et al. | |
| 5,569,390 A | 10/1996 | Endo | |
| 5,675,299 A | 10/1997 | Suski | |
| 5,864,470 A | 1/1999 | Shim et al. | |
| 6,144,102 A | 11/2000 | Amagai | |
| 6,465,950 B1 | 10/2002 | Baldi et al. | |
| 6,531,784 B1 | 3/2003 | Shim et al. | |
| 6,586,274 B2 | 7/2003 | Murata | |
| 6,667,546 B2 * | 12/2003 | Huang et al. | 257/691 |
| 6,790,760 B1 * | 9/2004 | Cohn et al. | 438/613 |
| 2003/0025201 A1 | 2/2003 | Harada | |
| 2003/0045083 A1 | 3/2003 | Towle et al. | |
| 2005/0117296 A1 * | 6/2005 | Wu et al. | 361/697 |
| 2006/0021788 A1 | 2/2006 | Kohayashi et al. | |
| 2007/0080456 A1 | 4/2007 | Chang | |

FOREIGN PATENT DOCUMENTS

| | | | | |
|---|---|---|---|---|
| JP | 04209558 | | 7/1992 | |
| JP | 10027863 | | 1/1998 | |
| JP | 11204688 | | 7/1999 | |
| JP | 2005/203634 | * | 7/2005 | H01L 21/60 |
| JP | 2005183495 | | 7/2005 | |
| JP | 2005203634 | | 7/2005 | |

* cited by examiner

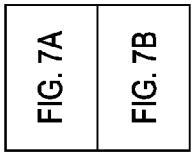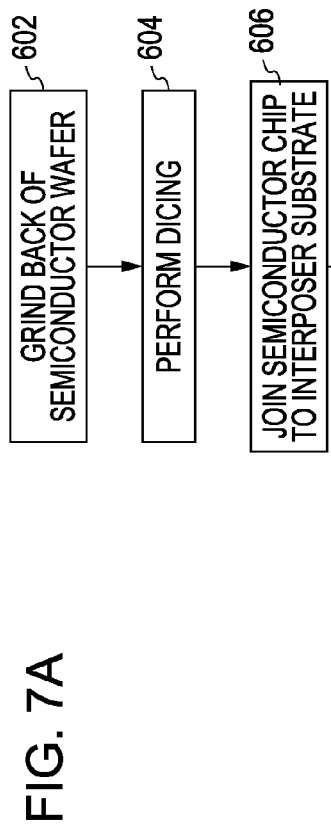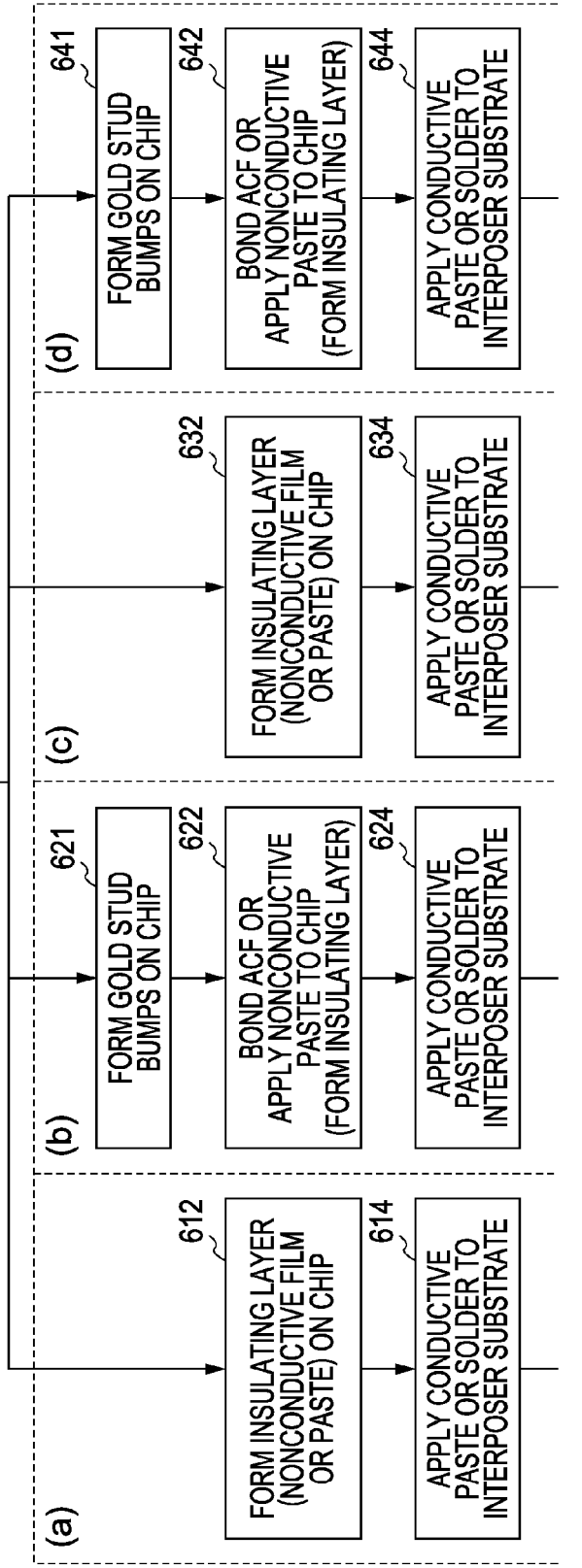

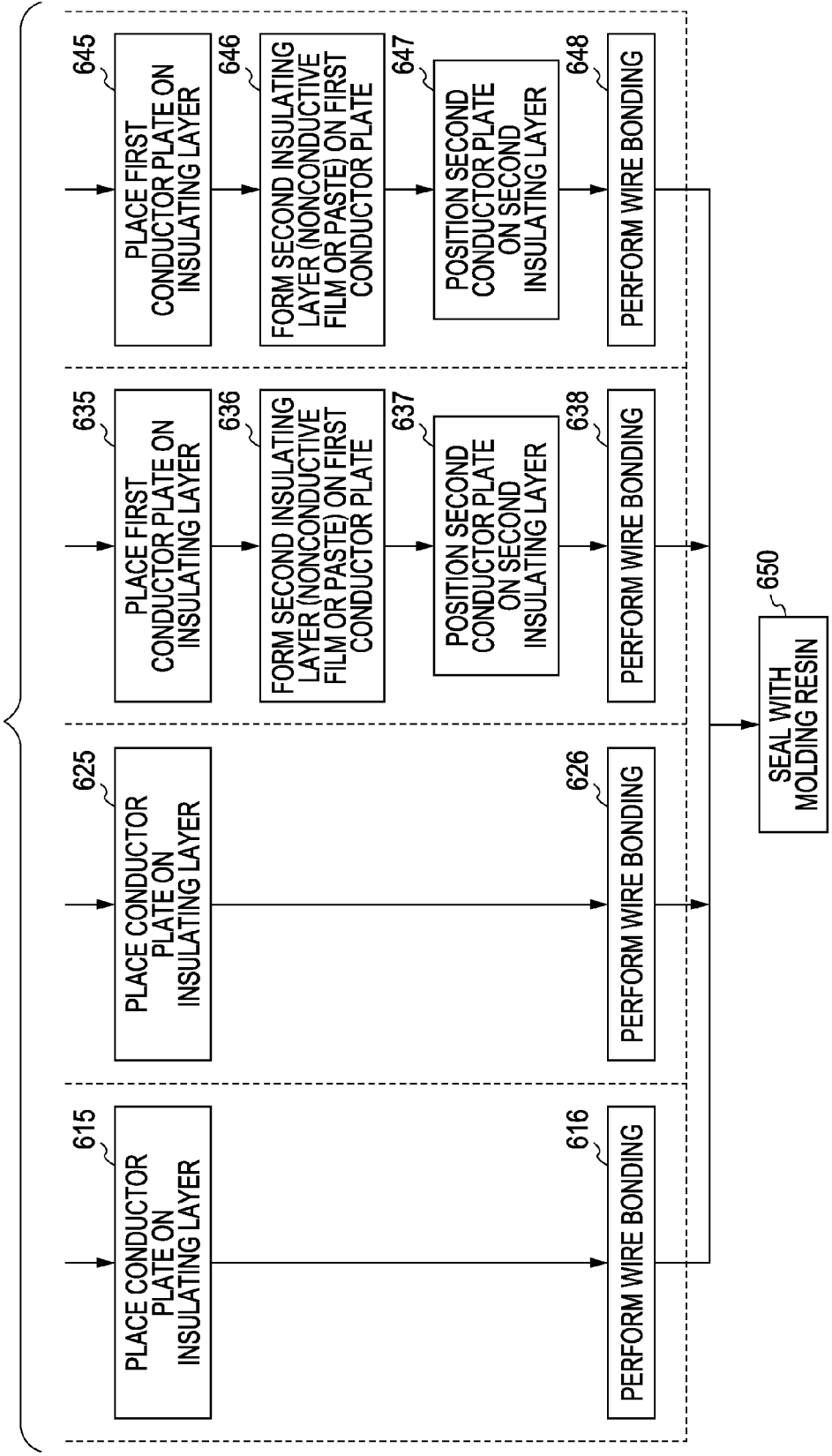

FIG. 9
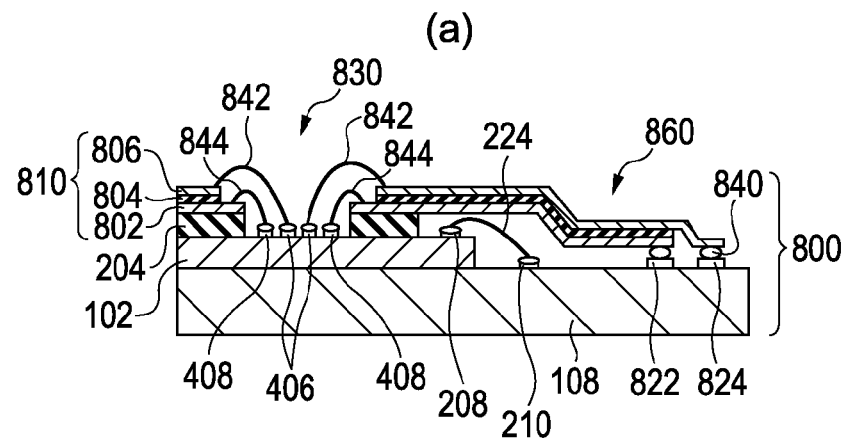
(a)
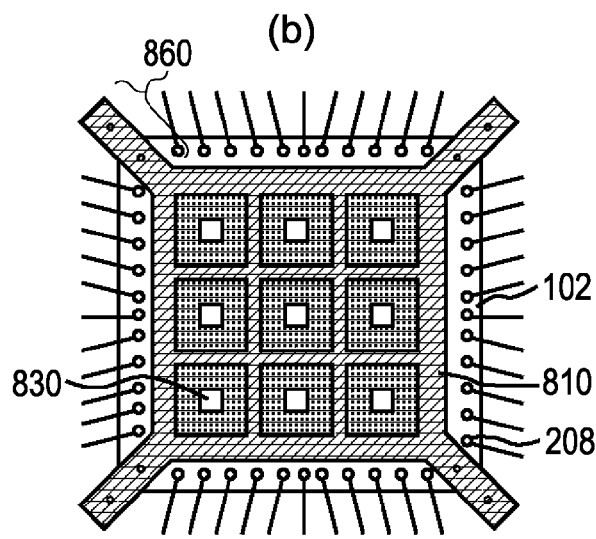
(b)
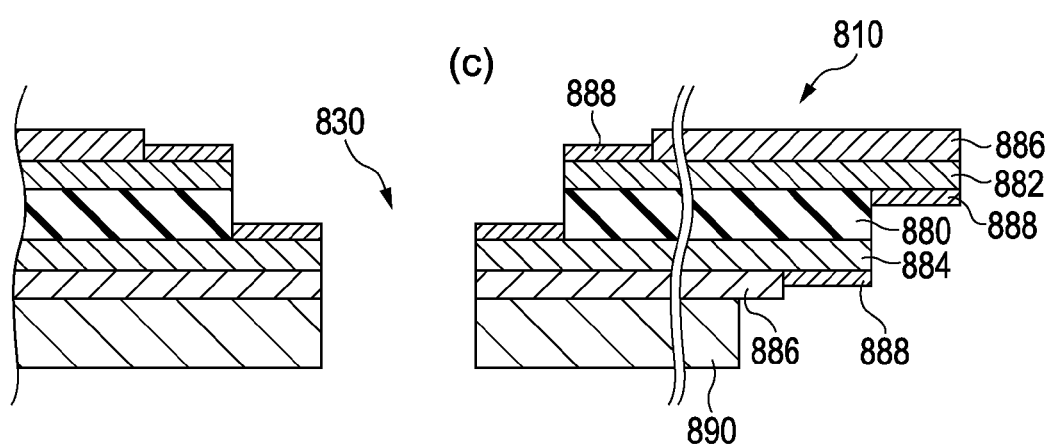
(c)

FIG. 10
(a)
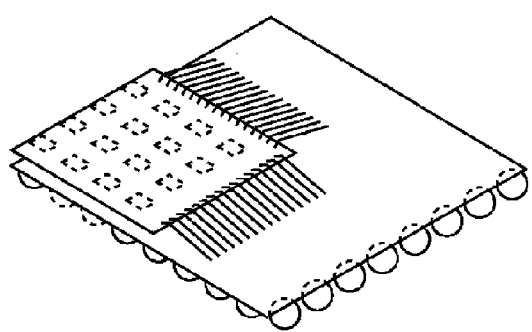
CENTER OF CHIP
| 0.0298 | | 0.0286 | | 0.0259 | | 0.0215 |
|---|---|---|---|---|---|---|
| 0.0286 | | 0.0276 | | 0.025 | | 0.0209 |
| 0.0259 | | 0.025 | | 0.0229 | | 0.0192 |
| 0.0215 | | 0.0209 | | 0.0192 | | 0.0168 |
VOLTAGE DROPS (V) ON CHIP     CORNER OF CHIP
(b)
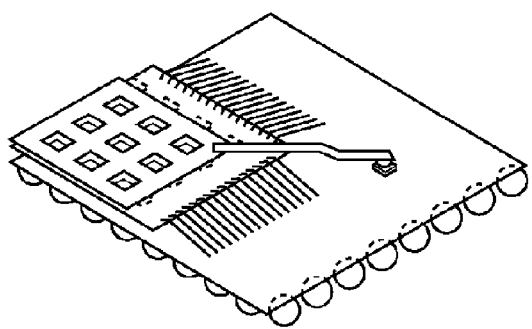
CENTER OF CHIP
| 0.0093 | | 0.0092 | | 0.0091 | | 0.0085 |
|---|---|---|---|---|---|---|
| 0.0092 | | 0.009 | | 0.0088 | | 0.0084 |
| 0.0091 | | 0.0088 | | 0.0082 | | 0.0079 |
| 0.0085 | | 0.0084 | | 0.0079 | | 0.0074 |
VOLTAGE DROPS (V) ON CHIP     CORNER OF CHIP

SEMICONDUCTOR PACKAGE AND METHOD FOR FABRICATING THE SAME

CROSS-REFERENCE TO RELATED APPLICATION(S)

This application is a Divisional of and claims the benefit of priority to U.S. patent application Ser. No. 12/054,156, filed Mar. 24, 2008 and entitled "Semiconductor Package and Method for Fabricating the Same, status pending, the contents of which are hereby incorporated by reference.

TECHNICAL FIELD

The present invention relates to a semiconductor package mounted on a circuit board. In particular, the present invention relates to a semiconductor package structure for reducing a voltage drop at a central portion of a semiconductor chip in a ball grid array (BGA) package and to a method for fabricating the same.

BACKGROUND ART

Examples of a surface-mount package for a semiconductor chip include BGAs and quad flat packages (QFPs). A BGA is a surface-mount package developed for a large scale integrated circuit (LSI) that has more pins than those in a QFP, which is a flat package that has leads extending in four directions. BGAs are very much used, as semiconductor packages for high-speed devices, in portable machines, such as cellular phones, or personal computers. A BGA package is joined to a mounting board by use of conductive balls (bumps) arranged in an array on its back as external terminals, instead of using a lead frame. Because the entire back surface of the semiconductor package can be used for connection to the board, the number of input/output pads can be markedly increased. However, to support recent higher functionality, the number of pins, i.e., input/output pins is being remarkably increased. One example of a BGA that supports multiple pins is a plastic BGA (PBGA) that uses an organic substrate as an interposer substrate (interposer). Although the bonding method or the number of wiring layers of an interposer may be different, a typical PBGA has a two-layer or multilayer structure, which enables multilayer wiring. Therefore, PBGAs can find wide application.

Although wire bonding is the mainstream of the bonding method, flip chip bonding is used in low resistance connection for high-speed application. For high heat dissipation (radiation) application, a structure that includes a radiating plate (or heatsink) at the surface of a package can also be used. Flip chip bonding using a BGA is effective for improvement in speed and functionality, but it is a relatively expensive packaging technology. With recent advances in circuit technology, attention is given to wire bonding using a BGA, which again achieves high functionality but inexpensive technology.

As illustrated in FIG. 13, a typical BGA semiconductor package 900 generally has a structure in which a ball grid array 920 including solder balls arranged on the back surface of a semiconductor chip 910 is soldered to an interposer substrate 930. The interposer substrate 930 is connected to pads 950 disposed on the upper surface of an external circuit board 960 by use of bumps or solder balls 940.

In design of known BGA packages using boding wires, in order to reduce wiring resistance in a semiconductor chip, wiring in the semiconductor chip is devised. For example, the length of a wire connected to each connection pad on the periphery of the semiconductor chip is minimized, thus reducing electrical resistance; or the number of pads for the ground and the power supply on the semiconductor chip is increased. However, when the chip size increases, the distance from the connection pad at the periphery of the chip to the central portion becomes long and wiring resistance is thus increased. This may lead to a decrease in stability of device operation caused by a voltage drop (IR drop).

A BGA flip-chip connected package in which solder bumps arranged in an array are connected to an interposer substrate is significantly more expensive than a BGA wire-bonded package because, although the effect of reducing a voltage drop at the central portion of the chip is large, it is necessary to form bumps and fine rules for substrate design.

Patent Document 1 discloses a method for establishing electric connections in a semiconductor by use of a second conductor connection portion (for use in supplying power and having a grid structure) bridging an electrode pad adjacent to the central portion of a principal surface of a semiconductor chip (central electrode) and an external terminal to prevent a voltage drop in the semiconductor chip. The electric connections of the grid conductor connection portion are established on the chip and the substrate, and the structure is held only by this electric connection portion. As a result, reliability of the joining portion and stability of holding of the structure may be impaired by a mismatch of thermal expansion coefficients of packaging materials.

Patent Document 2 discloses a semiconductor device that uses two conductive materials different from a normal lead frame for power-supply lines (Vdd, GND) in a semiconductor chip. More specifically, the plane of a conductor includes divided regions such that one corresponds to the power supply and the other corresponds to the ground. A terminal dedicated to input/output signals and a terminal dedicated to the power supply are provided. Because any number of power-supply dedicated leads can be arranged at any location of the chip, this device is advantageous in that the occurrence of malfunction resulting in a voltage drop is reduced. In this package, a pin extending from the conductor attached on the chip is connected to the outside (circuit) above the chip, whereas a signal line is connected from a lead on the periphery of the package. Therefore, the loop inductance of a power supply-signal line path is increased.

Patent Document 3 discloses a method for wire-bonding an electrode exposed on an electrode arrangement surface of a semiconductor chip to a conductive plane (power-supply plane and a ground plane) formed by processing a conductor film on a chip mounting surface of an insulating substrate of a semiconductor package to reduce parasitic inductance caused by the length of a bonding wire. The conductor chip electrode is not present at the central portion of the chip. The conductive plane is a single thin film, and the power-supply lines are divided in a planar manner.

[Patent Document 1] Japanese Unexamined Patent Application Publication No. 2005-203634

[Patent Document 2] Japanese Unexamined Patent Application Publication No. 10-27863

[Patent Document 3] Japanese Unexamined Patent Application Publication No. 11-204688

SUMMARY OF THE INVENTION

In accordance with the present invention, electric power can be supplied to the central portion of the chip through a conductor plate having small electric resistance. Therefore, compared with when connections are established only by high resistance wiring, a voltage drop at the central portion of the chip can be more reduced. In addition, the placement of a pad to be arranged for use in the power supply or a pad for use in the ground or pads for both at the central portion of the chip can reduce the number of pads for use in power lines as the power supply or the ground or both at the periphery of the chip. Therefore, chip design can support an increased number of pads for use in signal lines by using an area obtained by the reduction of power line pads.

Problems to be Solved

In a semiconductor package that uses wire bonding in interconnection of a semiconductor chip and a wiring substrate or an interposer substrate (hereinafter a wiring substrate on which a semiconductor chip is mounted and to which an external circuit is connected is referred to as an "interposer substrate"), a wire-bonding connection pad for input and output (fan-out) from the interposer substrate to the chip is disposed only on the periphery of the chip. That is, the current paths of the power supply and the ground always pass through the periphery of the semiconductor chip to reach the central portion. Therefore, when the chip size increases significantly (e.g., 8 mm or more square) at the central portion of the chip, the distance from the connection pad disposed at the periphery of the chip becomes long, the wiring resistance increases, and then a voltage thus decreases (IR drop). This may cause instability in device operation.

An object of the present invention is to reduce a voltage drop at the central portion of a semiconductor chip in a semiconductor package to stabilize device operation. Additionally, an object of the present invention is to enable design that reduces the number of connection pads for the power supply and the ground at the periphery of the chip and assigns pads obtained by the reduction in the connection pads as signal pads by supplying power and ground potential from the central portion of the chip, that is, to enable multiple pins for allowing the number of signal pads to be increased in design for the periphery of the chip.

Another object of the present invention is to reduce loop inductance, in particular, in a BGA semiconductor package, by connecting power-supply wiring and ground wiring on a semiconductor chip to wiring pads disposed on an interposer substrate and connecting the interposer substrate directly to an external circuit through, for example, a solder ball.

Still another object of the present invention is to provide a method for fabricating a semiconductor package having a structure that reduces a voltage drop at the central portion of a semiconductor chip.

Means for Solving the Problems

In a semiconductor package having a semiconductor chip including a wire-bonded periphery, pads for use in the power supply and ground are disposed at the central portion of the chip. A conductor having a single or two conductor plates is attached to the surface of the chip such that an insulating layer is disposed between the chip and each of the conductor plates. The chip and the conductor plate are connected together by wire bonding or with stud bumps. The conductor plate and a wiring substrate are joined together by soldering or with conductive paste.

According to a first aspect of the present invention, a semiconductor package includes a wiring substrate, a semiconductor chip, and at least one conductor. The wiring substrate has a power-supply wiring pad. The semiconductor chip is disposed on the wiring substrate and has a plurality of peripheral electrode pads and at least one central electrode pad on a principal surface thereof. The plurality of peripheral electrode pads is connected to the wiring substrate. The central electrode pad is disposed so as to be surrounded by the peripheral electrode pads and receive power supplied from the wiring substrate. The conductor is disposed on the semiconductor chip and electrically connected to the central electrode pad. The conductor has at least one extraction (or outgoing line) portion connected to the power-supply wiring pad of the wiring substrate. The semiconductor package may further include an insulating (or dielectric) layer. The conductor may be a conductor plate. The conductor plate may be disposed on the semiconductor chip such that the insulating layer is disposed therebetween. Preferably, the plurality of peripheral electrode pads may be electrically connected to the wiring substrate using bonding wires.

Preferably, the conductor plate may be bonded onto the insulating layer on the semiconductor chip, and the insulating layer may comprise a nonconductive film or nonconductive paste.

The wiring substrate may be a ball grid array (BGA) substrate or a plastic BGA (PBGA) substrate constituting an interposer substrate connected to an external circuit.

The conductor plate and the insulating layer may have at least one opening at a position corresponding to the central electrode pad. The conductor plate may be electrically connected to the central electrode pad through the opening using a bonding wire. Preferably, the at least one opening may comprise a plurality of openings arranged in a grid. The insulating layer may comprise an anisotropic conductive film or nonconductive paste. The conductor plate may be electrically connected to the central electrode pad using a stud bump (e.g., gold stud bump). When a gold stud bump is used, the insulating layer may comprise an anisotropic conductive film (ACF) or nonconductive paste.

The conductor plate may be used in either ground wiring or power-supply wiring or both. Preferably, the conductor plate may be made of a metal and be subjected to surface treatment of metal plating.

The semiconductor package may further include a second insulating layer and a second conductor plate. The second insulating layer may be disposed on the conductor plate. The second conductor plate is disposed on the second insulating layer and have at least one second extraction portion connected to the power-supply wiring pad of the wiring substrate. The second conductor plate may be electrically connected to the central electrode pad on the semiconductor chip. The second conductor plate may be used in either ground wiring or power-supply wiring or both.

Preferably, the conductor plate, the second insulating layer, and the second conductor plate may be integrally formed into a multilayer plate, and each of the conductor plate and the second conductor plate may be used in power-supply wiring or ground wiring. The multilayer plate may have at least one extraction portion and an opening corresponding to the central electrode pad, and a surface of the conductor plate may be exposed in accordance with an arrangement of the central electrode pad.

According to a second aspect of the present invention, a method for fabricating a semiconductor package includes the steps of (a) preparing a wiring substrate having a power-supply wiring pad, (b) preparing a semiconductor chip having a plurality of peripheral electrode pads and at least one central electrode pad on a principal surface thereof, the plurality of peripheral electrode pads being connected to the wiring substrate, the central electrode pad being disposed so as to be surrounded by the peripheral electrode pads and receiving power supplied from the wiring substrate, (c) joining the semiconductor chip to the wiring substrate, (d) preparing a conductor plate having at least one edge at a periphery thereof, (e) forming an insulating layer on at least part of an upper surface of the semiconductor chip, (f) disposing the conductor plate on the insulating layer, (g) connecting the edge of the conductor plate to the power-supply wiring pad of the wiring substrate, and (h) connecting at least part of the conductor plate except for the edge to the central electrode pad.

Preferably, the edge of the conductor plate may be an extraction (or outgoing line) portion, the conductor plate and the insulating layer may have an opening corresponding to the central electrode pad, and the at least part of the conductor plate may be connected to the central electrode pad through the opening by wire bonding.

The semiconductor chip may have a gold stud bump on the central electrode pad, and the insulating layer may comprise an anisotropic conductive film.

Preferably, the method may further include the steps of preparing a second conductor plate having at least one second edge at a periphery thereof and an opening corresponding to the central electrode pad, forming a second insulating layer on at least part of an upper surface of the conductor plate, disposing the second conductor plate on the second insulating layer, connecting the second edge to the power-supply wiring pad of the wiring substrate, and connecting at least part of the second conductor plate except for the second edge to the central electrode pad.

Preferably, the second edge may be a second extraction portion, the insulating layer may have an opening corresponding to the conductor plate, the second insulating layer may have an opening corresponding to the second conductor plate, and the at least part of the second conductor plate may be connected to the central electrode pad through the openings by wire bonding. A multilayer plate in which the conductor plate, the second insulating layer, and the second conductor plate are integrally formed may be used. Preferably, the multilayer plate may have at least one peripheral extraction portion and an opening corresponding to the central electrode pad.

The above and other objects and features of the present invention will become more apparent from the following detailed description with reference to the attached drawings. The drawings are provided only for illustrative purposes and are not intended to limit the scope of the present invention.

BRIEF DESCRIPTION OF THE DRAWINGS

FIG. 2(a) is a cross-sectional view of the semiconductor package. FIG. 2(b) is a plan view of a basic structure. FIG. 2(c) is a plan view of a structure that has a plurality of openings.

FIG. 3(a) is a cross-sectional view of the semiconductor package. FIG. 3(b) is a plan view of a basic structure. FIG. 3(c) is a plan view of a structure that has a plurality of openings.

FIG. 4(a) is a cross-sectional view of the semiconductor package. FIG. 4(b) is a plan view of a basic structure.

FIG. 5(a) is a cross-sectional view of the semiconductor package. FIG. 5(b) is a plan view of the semiconductor package.

FIG. 6(a) is a cross-sectional view of the semiconductor package. FIG. 6(b) is a plan view of the semiconductor package.

FIG. 7 illustrates a process flow for fabricating a semiconductor package according to an embodiment of the present invention. Process blocks (a), (b), (c), and (d) correspond to a method for fabricating a semiconductor package illustrated in FIG. 2, that in FIG. 3 (or FIG. 4), that in FIG. 5, and that in FIG. 6, respectively.

FIG. 9 illustrate a semiconductor package that uses an integrated multilayer plate according to an embodiment of the present invention. FIG. 9(a) is a cross-sectional view of the semiconductor package. FIG. 9(b) is a plan view of the semiconductor package. FIG. 9(c) is a detailed cross-sectional view of the integrated multilayer plate.

FIG. 10 illustrate voltage drops at the central portion of a chip occurring when high-density short wires are used in wire bonding connection at the periphery of the chip and Au stud bumps are used in connection to central electrode pads for a structure that includes no conductor plate in FIG. 10(a) and a structure that includes a conductor plate in FIG. 10(b).

Figure 1:
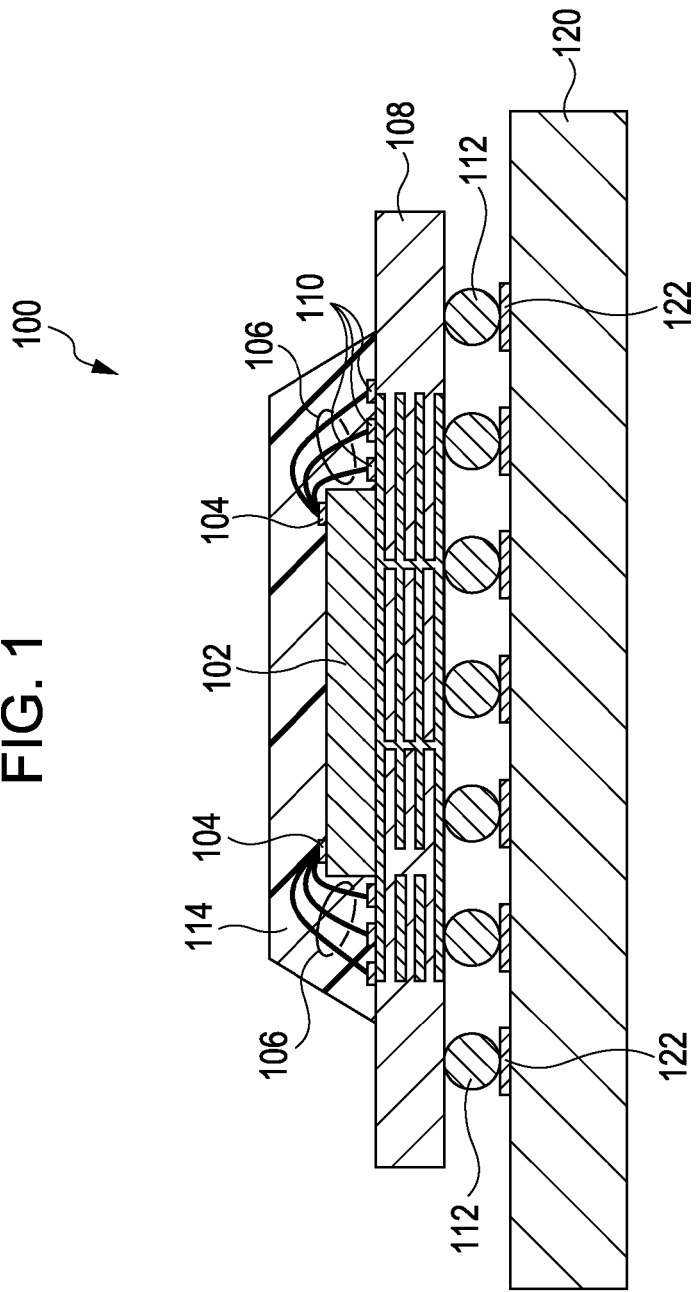
FIG. 1 is a diagram of an example of a semiconductor package using a plastic ball grid array (PBGA) to which the present invention is applicable.

REFERENCE NUMERALS 100, 200, 300, 400, and 500: semiconductor package
102: semiconductor chip
104: electrode pad
106: gold wire
108: interposer substrate (wiring substrate)
110: wiring pad
112: solder ball
114: molding resin
120: external circuit board
122: wiring pad
202: conductor plate
204: insulating (dielectric) layer
206: central electrode pad
208: peripheral electrode pad
210: conductive wiring pad 214: solder (or conductive paste)
216: via
220: power-supply wiring pad
222, 224: Au wire
230: opening
232: extraction portion
322: Au stud bump
402: second conductor plate
404: second insulating layer
406, 408: central electrode pad
414: solder (or conductive paste)
420, 520: power-supply wiring pad
422: Au wire
432, 532: extraction (outgoing line) portion
502: second conductor plate
504: second insulating layer

BEST MODE FOR CARRYING OUT THE INVENTION

For a ball grid array (BGA), and in particular a plastic BGA (PBGA) semiconductor package, a structure is provided in which a single or two conductor plates or a multilayer plate having an opening is mounted on, for example, attached to the surface of a semiconductor chip such that an insulating layer is disposed therebetween, a connection pad for use in power-supply/ground line (in the following description, for either the power supply or the ground or both is referred to this) is initially formed, the connection pad on the upper surface of the chip and the conductor plate are connected together, and an extraction portion extending from the conductor plate is connected to a wiring substrate, in particular, an interposer substrate (which indicates a wiring substrate on which the chip is mounted and to which the chip is electrically connected, the wiring substrate being connectable to an external circuit). Although a semiconductor package described below includes a BGA semiconductor chip mounted on an interposer substrate composed of, typically, a multilayer structure (hereinafter abbreviated as a "chip"), it is to be noted that the semiconductor chip and the interposer substrate can include various forms. For example, the semiconductor chip may be of a type other than the BGA type, and the number of layers and the material of the interposer substrate may be freely set.

A method for fabricating a semiconductor package according to an aspect of the present invention is generally described below. First, a pad for power-supply/ground line is formed on the central portion of a principal surface (a surface that has a circuit) of a semiconductor chip. Then, an insulating layer is formed by application of nonconductive paste to the chip or by bonding of a nonconductive film or an anisotropic conductive film (ACF) to the chip. A conductor, i.e., a conductor plate made of a highly conductive metal (e.g., copper) is arranged, typically bonded, on the insulating layer. The conductor plate is plated with metal (e.g., silver or palladium) to facilitate wire bonding connection. An opening is formed in a necessary place of the insulating layer and the conductor plate, thus enabling wire bonding connection from the electrode pad at the central portion of the chip to the conductor plate. The electrode pad disposed inside from, and so as to be surrounded by a plurality of peripheral electrode pads arranged at the periphery of the chip is referred to as a central electrode pad. An extraction portion to be a wiring lead is extracted from each of the four corners and, as required, from an appropriate place of each side, of the conductor plate, similar to a hanging pin of a lead frame. It is down set in consideration of the thickness of the chip. When the conductor plate is bonded to the chip, the down-set extraction portion is connected to a power-supply wiring pad on the interposer substrate (or a wiring substrate). The connection to the interposer substrate can be made by use of conductive paste or soldering. The connection between the pad at the central portion of the chip and the conductor plate (for use in ground or power-supply wiring) can also be made by formation of a gold bump on the pad at the central portion of the chip and by use of an ACF or nonconductive paste for the insulating layer.

Embodiments of the present invention are described below with reference to the drawings.

FIG. 1 is a schematic diagram of a semiconductor package to which the present invention is applied, for example, a semiconductor package of the PBGA type. In a PBGA semiconductor package 100, generally, peripheral electrode pads 104, including a signal (Vsig) electrode pad, power supply voltage (VDD) electrode pad, and a ground (GND) electrode pad are formed at the periphery of a principal surface of a semiconductor chip 102. The peripheral electrode pads 104 are connected to a conductive wiring pad portion 110 joined to circuit wiring of an interposer substrate 108 with gold wires 106 for use in bonding connection. The circuit wiring of the interposer substrate 108 is electrically connected to pads (lands) 122 of an external circuit board 120 through solder balls (or metal bumps) 112. Instead of gold-wire bonding illustrated in FIG. 1, gold stud bumps may be used for connection. The interposer substrate (also called the interposer) 108 may be a multilayer build-up printed circuit board. To protect the entire semiconductor chip 102, the semiconductor chip 102 and the gold wires 106 may be sealed with molding resin 114 after wire-bonding connection is performed. Hereinafter, the semiconductor chip is also called the "chip" for brevity.

Figure 2:
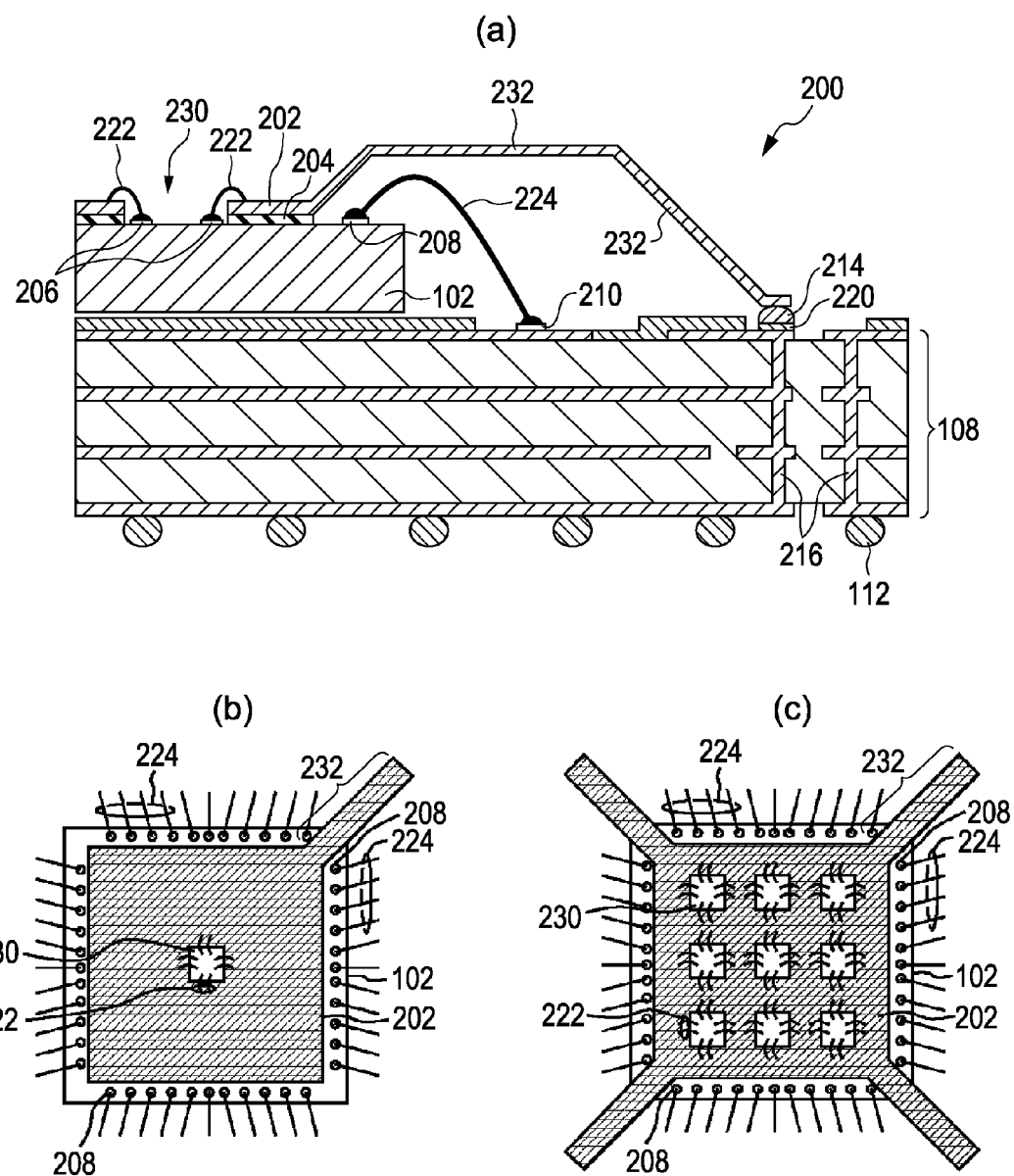
FIG. 2 are schematic views of a semiconductor package that includes a single conductor plate and uses wire bonding connection according to an embodiment of the present invention.

FIG. 2 illustrate a semiconductor package 200 which uses a single conductor plate disposed on the chip to reduce a voltage drop at the central portion of the chip according to an embodiment of the present invention. FIG. 2(a) is a cross-sectional view of the semiconductor package 200. FIG. 2(b) is a partial plan view of a basic structure using a conductor plate 202 that has a single opening 230 and a single extraction portion 232. FIG. 2(c) is a partial plan view of an applied structure using a conductor plate 202 that has a plurality of openings 230 (arranged in a grid in the drawing) and extraction portions 232 extending from the four corners of the conductor plate 202. One or more central electrode pads 206 receive power supplied from the interposer substrate 108 through the extraction portion(s) 232 and the conductor plate 202. The conductor plate 202 is disposed on an insulating layer 204 comprising nonconductive paste or a nonconductive film disposed on the chip 102. The conductor plate 202 is a plate that includes conductive wiring for power supply voltage (VDD) or ground (GND). The conductor plate 202 can also be called a "power-supply/ground plane" because it is a plane that includes conductive wiring used for power-supply/ground. However, for the sake of simplicity, it is called the "conductor plate".

In FIG. 2, the conductor plate 202 is a single-layer structure. However, the conductor plate 202 can be a multilayer conductor-plate structure. In the case of a two-layer structure, a plate for power-supply (VDD) wiring and a plate for ground (GND) can be formed as different layers (see FIGS. 5 and 6). Preferably, the conductor plate may be a metal plate made of highly conductive metal (e.g., copper). However, instead of a planar conductor plate capable of having a layer structure, a highly conductive conductor can be used (in the specification, a conductive structure is called a "conductor"). For example, a conductive rectangular parallelepiped or cylinder can be used. It is to be noted that various modifications can be made, for example, the structure is formed as a grid or part of the plate is thicker or thinner.

As illustrated in FIG. 2(b), the single conductor or single-layer plate 202 is disposed on the chip 102 on the interposer substrate 108 being a wiring substrate such that the insulating layer 204 is disposed therebetween. The single conductor plate 202 includes the single opening 230 corresponding to the central electrode pads 206 at the central portion of the chip 102 and the single extraction portion 232. The central electrode pads 206 are arranged on the principal surface (a surface that has a circuit) of the chip 102 exposed through the opening 230 of the conductor plate 202. The central electrode pads 206 and the conductor plate 202 are bonded together by use of gold (Au) wires 222. Peripheral electrode pads 208 disposed at the periphery of the chip are typically bonded to conductive wiring pads 210 disposed on the upper surface of the interposer substrate (interposer) 108 by use of Au wires 224. The conductive wiring pads 210 include power-supply and ground (VDD, GND) wiring pads and also include a signal wiring pad. Electrode pads disposed so as to be surrounded by the peripheral electrode pads 208 at the periphery of the chip are referred to as the central electrode pads 206. For the sake of convenience, the opening 230 is illustrated in the center of the chip. However, the position and size of the opening 230 may vary, depending on the size of the chip, circuit design on the chip, arrangement of the extraction portions of the conductor plate, and arrangement of the central electrode pads on the chip. In other words, it is preferable that the central electrode pads and the opening of the conductor plate corresponding thereto be arranged at a portion where a voltage drop will be large on the chip.

FIG. 2(c) illustrates the conductor plate 202 in which a plurality of openings 230 on the principal surface of the chip are disposed so as to be surrounded by the peripheral electrode pads 208 at the periphery of the chip. The semiconductor package according to this embodiment has the rectangular openings 230 of the conductor plate 202 aligned in a grid (or a grid structure) and the extraction portions 232 extending from the four corners. Therefore, wiring resistance to the central portion of the chip can be further reduced. It is to be noted that the shape, number, and arrangement of openings can be freely set depending on circuit design of the chip. The conductor plate can typically have a thickness of 20 μm to 200 μm. Therefore, the thickness of the conductor plate can be at least one order of magnitude larger than that of wiring lines formed by a thin film within the chip (several micrometers at the maximum). As a result, electrical resistance can be significantly reduced, including an increment of wiring width.

The outer portions of the conductor plate 202 (preferably the four corners) are extended to form the extraction portions 232. The extraction portions 232 are down set, as illustrated in FIG. 2(a), and are connected to power-supply wiring pads (i.e., power-supply voltage pads or ground wiring pads) 220 disposed on the upper surface of the interposer substrate 108 with solder (or conductive paste) 214. The extraction portions 232 are not limited to extensions from the four corners of the conductor plate. The extraction portions 232 can be formed at any place of the outer portions of the conductor plate as long as the place is easy to receive power supplied from the interposer substrate 108. Preferably, the extraction portions 232 may be integral with the conductor plate 202. However, the extraction portions 232 can be separated from the conductor plate 202, and can be electrically connected to each of the conductor plate 202 and the wiring pads 220 of the interposer substrate 108. Typically, as illustrated in FIG. 2(b) or 2(c), the Au wires 224 for connection to the peripheral electrode pads 208 of the semiconductor chip 102 do not overlap the extraction portion(s) 232 in plan view. The positions of the peripheral electrode pads 208 at the periphery of the chip and the Au wires 224 are not limited to the four sides of the outer portions of the chip 102. The peripheral electrode pads 208 and the Au wires 224 can be formed at any place of the periphery of the chip. In addition, as in general semiconductor packages, the entire structure, including the semiconductor chip 102, the peripheral Au wires 224, and the conductor plate 202 with the extraction portions 232, can be sealed with molding resin (114 in FIG. 1), as illustrated in FIG. 1. It is to be noted that, although the detailed description is omitted below, structures and methods relating to general semiconductor packaging technology, including this sealing with molding resin in the present embodiment, can be combined to the embodiments of the present invention.

Metal plating as surface treatment to the conductor plate 202 and the extraction portions 232 ensures stable electrical connection. Preferably, silver or palladium may be used in metal plating. In general, to enhance solder wettability, metal plating with metal having low corrosivity, low rust formation, and low surface oxide film formation, can be performed. For example, gold, silver, tin, solder (an alloy of lead and tin), rhodium, palladium, and nickel (including electroless nickel) can be used for plating. For plating to wire bonding, gold, silver, and nickel can be used. Wire bonding is, for example, a technique of metallically bonding pads on a wiring substrate and gold wires together by ultrasonically vibrating the gold wires while loading the wiring substrate heated at 130° C. to 190° C.

As illustrated in FIG. 2(a), the interposer substrate 108 is typically a multilayer substrate that uses an organic-material (e.g., glass cloth or epoxy resin) substrate and has a via 216 for allowing wiring in each layer. The via 216 is filled with conductive paste, thus vertically connecting copper wiring formed by patterning of the surface of each layer. To connect the wiring of the interposer substrate 108 and the external circuit board, the solder balls 112 can be provided on the lower surface of the interposer substrate 108. The interposer substrate 108 can be a build-up structure in which an insulating layer and a wiring layer are built up on the printed circuit board (PCB) as the base substrate, or can be a build-up substrate structure in which insulating layers having filled vias are stacked. Alternatively, the chip can be directly connected to the external circuit board being a wiring substrate, such as a printed board, without the interposer substrate 108.

Figure 3:
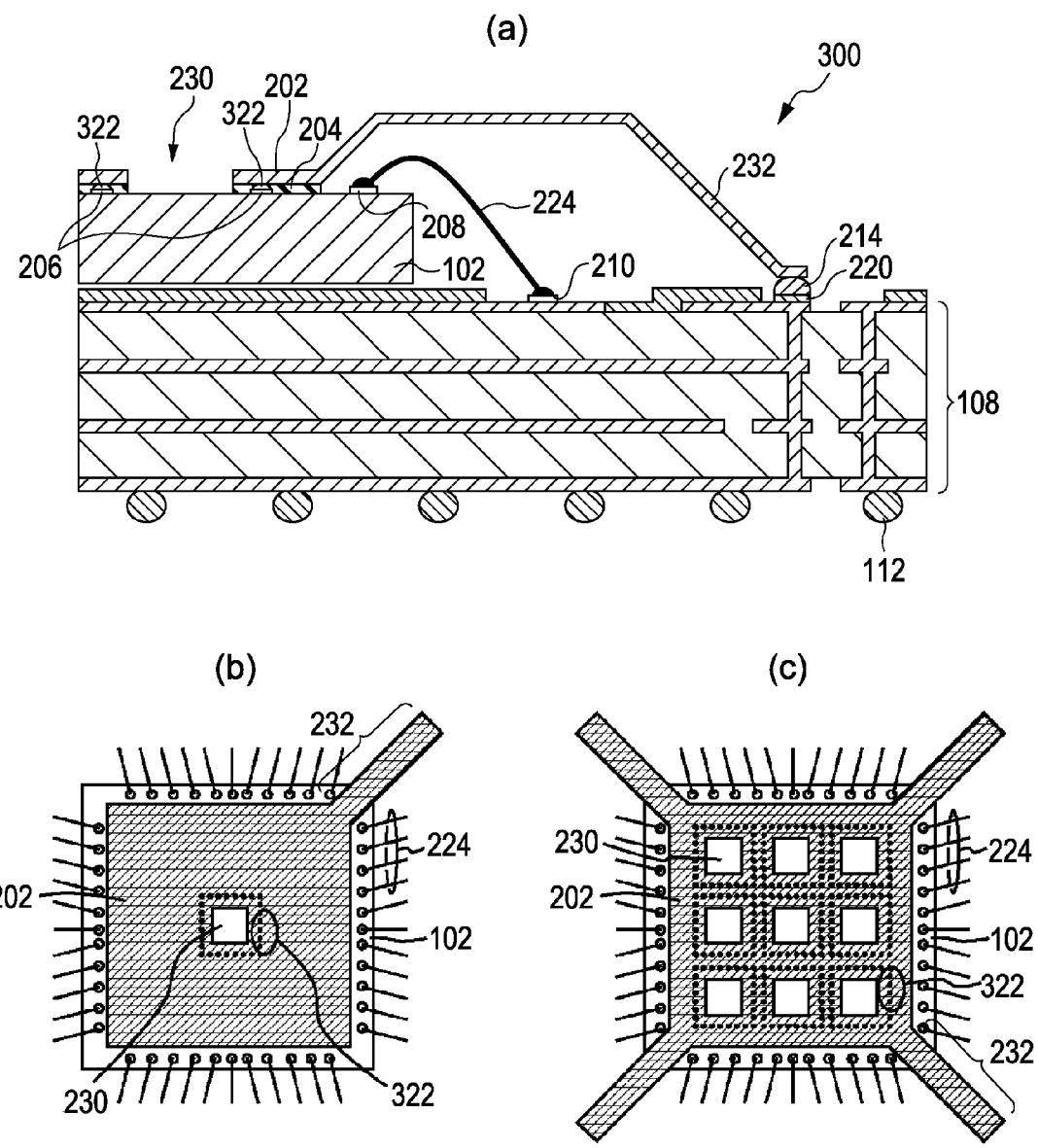
FIG. 3 are schematic views of a semiconductor package that includes a single conductor plate and uses Au stud bump connection according to an embodiment of the present invention.

FIG. 3 illustrate a semiconductor package 300 which uses a single conductor plate having the opening(s) 230 on the chip, as in FIG. 2, and being connected to the chip with a stud bump according to an embodiment of the present invention. The stud bump can be made of a conductive material, typically gold. FIG. 3(a) is a cross-sectional view of the semiconductor package 300. FIG. 3(b) is a partial plan view of a basic structure using the conductor plate 202 having the single opening 230 and the single extraction portion 232. FIG. 3(c) is a partial plan view of an example structure using the conductor plate 202 having a plurality of openings 230 (arranged in a grid in the drawing) and the extraction portions 232 extending from the four corners of the conductor plate. The semiconductor package illustrated in FIG. 3 has a structure in which the conductor plate 202 is connected to the central electrode pads 206 on the semiconductor chip 102 with Au stud bumps 322. As illustrated in FIG. 3(b), when the conductor plate 202 has the opening 230, unlike FIG. 2, which use bonding wires, the central electrode pads 206 are arranged around (and outside) the opening 230, not inside the opening 230, on the upper surface of the chip, and the Au stud bumps 322 are disposed on these pads. Preferably, the insulating layer 204 disposed on the semiconductor chip 102 may comprise an ACF. In this case, only an ACF portion immediately above each of the Au stud bumps 322 is conductive by thermocompression bonding, thus enabling the central electrode pads 206 on the semiconductor chip 102 and the conductor plate 202 to be connected together. Instead of the ACF, nonconductive paste can be used in the insulating layer 204. In this case, preferably, nonconductive paste corresponding to the Au stud bump 322 may be removed in advance before the conductor plate 202 is placed. In FIG. 3, the insulating layer 204 and the conductor plate 202 have the opening(s) 230. However, the opening(s) 230 can be omitted when an ACF is used (see FIG. 4). In the semiconductor package illustrated in FIG. 3, to improve accuracy of positioning the conductor plate, an alignment mark can be put on the semiconductor chip below the opening of the conductor plate in advance.

Figure 4:
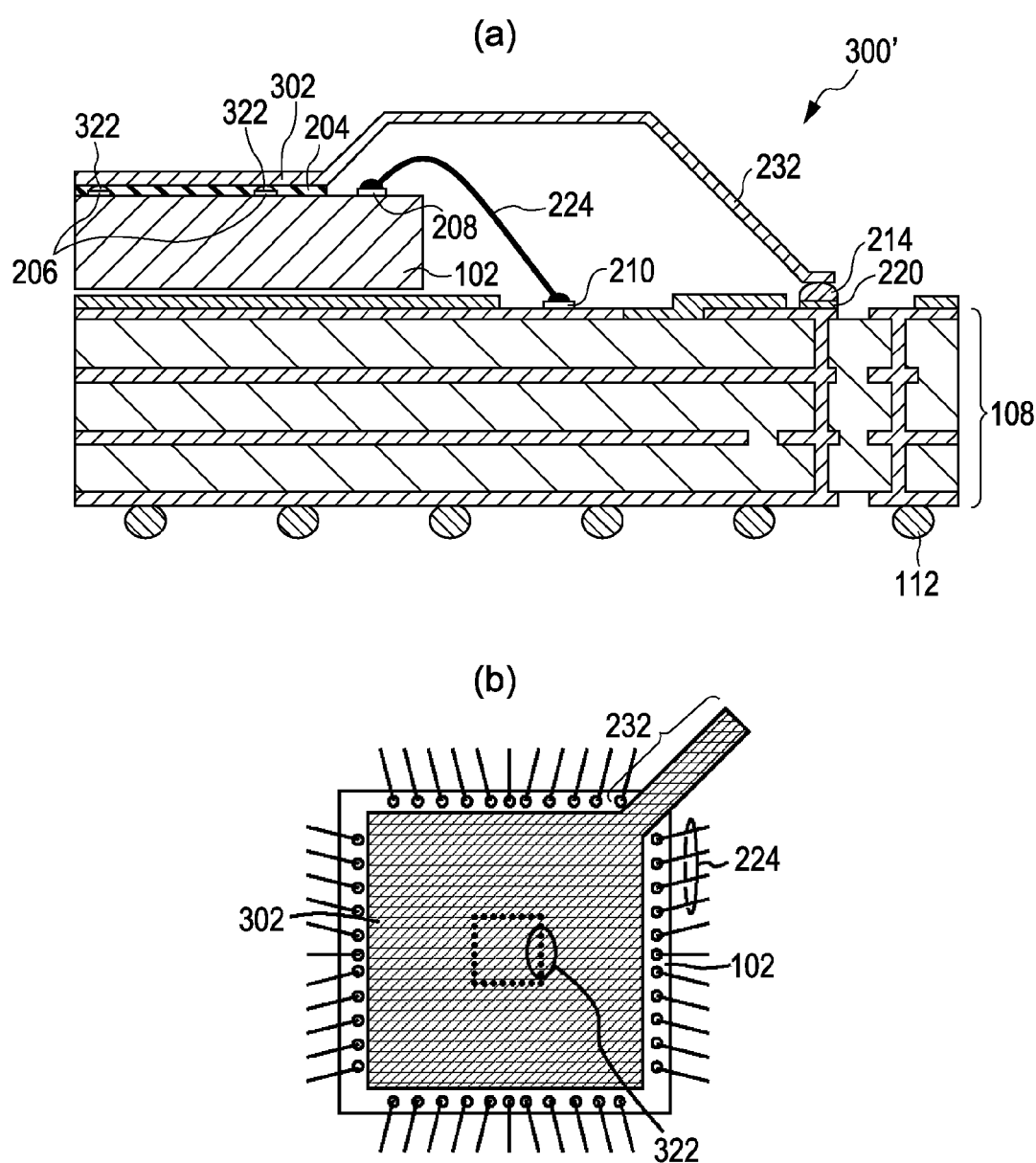
FIG. 4 are schematic views of a semiconductor package that uses Au stud bump connection for a single conductor plate having no opening according to an embodiment of the present invention.

FIG. 4 illustrate a semiconductor package 300' which uses a single conductor plate 302 having no opening and being connected to the chip with Au stud bumps according to an embodiment of the present invention. FIG. 4(a) is a cross-sectional view of the semiconductor package 300'. FIG. 4(b) is a partial plan view of a basic structure. Although not illustrated, a plurality of central electrode pads arranged in a grid can be formed, as in FIG. 3(c). In this case, preferably, the extraction portions 232 may extend from the four corners of the conductor plate 302. As illustrated in FIG. 4(a), the insulating layer 204 formed by bonding of an ACF or application of nonconductive paste to the chip 102 may have no opening. In addition, the conductor plate 302 on the insulating layer 204 is not required to have an opening. In FIG. 4, the conductor plate 302 and the central electrode pads 206 on the chip 102 are connected together through the Au stud bumps 322 passing through (penetrating) the insulating layer 204. By devising design of an opening of the conductor plate, Au stud bump connection (central electrode pads are arranged around the opening) and wire bonding connection (central electrode pads are arranged inside the opening) can be used in combination. This combined connection method can support complicated circuit design on the principal surface of the chip and appropriately design the position and size of the opening of the conductor plate. As a result, a voltage drop at the central portion of the chip can be reduced.

To connect the semiconductor chip to the wiring substrate by ACF connection, i.e., using an ACF, they are pressure-welded using a heat tool heating at 180° C. to 220° C. At this time, because the mounting surfaces face each other, flatness of a pad surface is necessary. According to the ACF connection, with heat and pressure, vertical electrical connection can be established through conductive particles sandwiched between the upper and lower electrodes while bonding, and lateral insulating function can be maintained.

Figure 5:
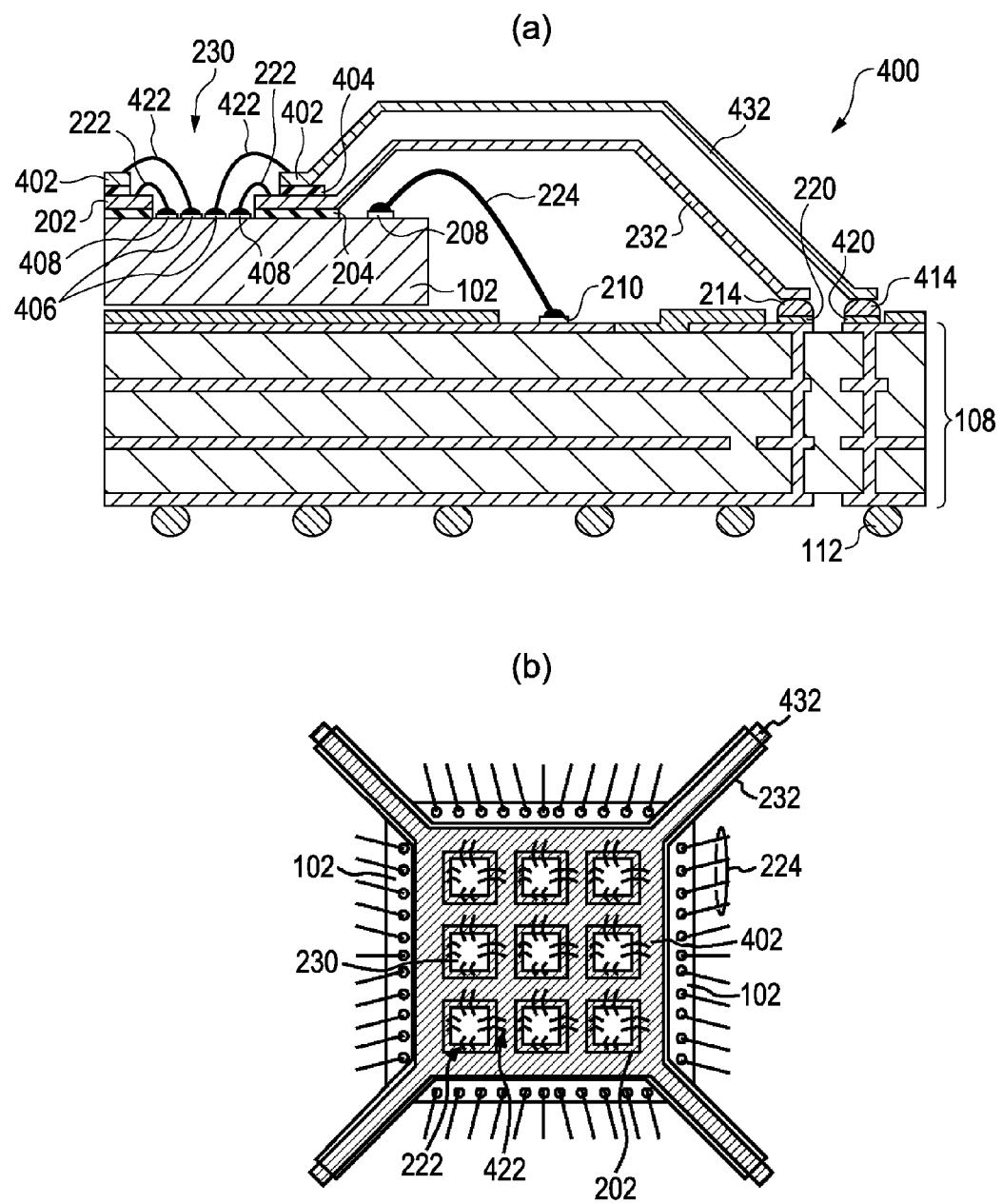
FIG. 5 are schematic views of a semiconductor package that includes two conductor plates and uses wire bonding in connection to each conductor plate according to an embodiment of the present invention.

FIG. 5 illustrate a semiconductor package 400 which uses two conductor plates and uses wire bonding in connection between each of the conductor plates and each of the central electrode pads on the semiconductor chip according to another embodiment of the present invention. The semiconductor package 400 uses a two-layer conductor-plate structure in which a second insulating layer 404 is disposed on the first conductor plate 202, illustrated in FIGS. 2, and a second conductor plate 402 is disposed on the second insulating layer 404. As illustrated in FIG. 5, each of the insulating layer 204, the first conductor plate 202, the second insulating layer 404, and the second conductor plate 402 has an opening. The surface of the first conductor plate 202 is exposed in an opening. Preferably, the conductor plates may have different functions. For example, the first conductor plate 202 is used in power supply voltage wiring, and the second conductor plate 402 is used in ground wiring. The function for the first conductor plate and that for the second conductor plate can be interchanged, i.e., the first conductor plate can be used in ground wiring, and the second conductor plate can be used in power supply voltage wiring. Each of the conductor plates can include electrically divided regions such that ground wiring and power supply voltage wiring are assigned to the respective regions. In addition, the conductor plate can have a multilayer structure composed of three or more layers. Preferably, the insulating layer 204 and the second insulating layer 404 may be formed by a nonconductive film or nonconductive paste.

As illustrated in FIG. 5(a), a plurality of central electrode pads (406, 408) are disposed on the upper surface of the chip 102 exposed through the opening 230 of the conductor plate 202. Examples of the central electrode pads include one or more power supply voltage (VDD) pads 406 and one or more ground (GND) pads 408. The power supply voltage pads and the ground pads can be arranged in accordance with circuit design on the chip. The central electrode pads 408 and 406 are bonded to the first conductor plate 202 and the second conductor plate 402, respectively, with the Au wires 222 and Au wires 422, respectively. The peripheral electrode pads 208 at the periphery of the chip are typically bonded to the conductive wiring pads 210 for use in signal lines and other purposes on the upper surface of the interposer substrate (interposer) 108 with the Au wires 224. The extraction portions 232 extend from the four corners of the first conductor plate 202, and extraction portions 432 extend from the four corners of the second conductor plate 402. The extraction portions 232 and 432 are down set and are connected to the power-supply wiring pads 220 and ground wiring pads 420 on the upper surface of the interposer substrate 108 with the solder (or conductive paste) 214 and 414, respectively. FIG. 5(b) illustrates a structure in which the extraction portions 232 and 432 are down set so as to have different heights and overlap each other in plan view. However, any number of the extraction portions can be used, and the extraction portions can be arranged in any place of the periphery of the conductor plate. Alternatively, the extraction portions can be arranged so as not to overlap each other in plan view. Preferably, each of the extraction portions may be integral with the conductor plate. However, the extraction portions can be separated from the conductor plate, and electrical connection can be established to each of the conductor plate and the interposer substrate. The semiconductor package 400 according to the embodiment illustrated in FIG. 5 may have a basic structure in which each of the conductor plates has a single opening and a single extraction portion.

Figure 6:
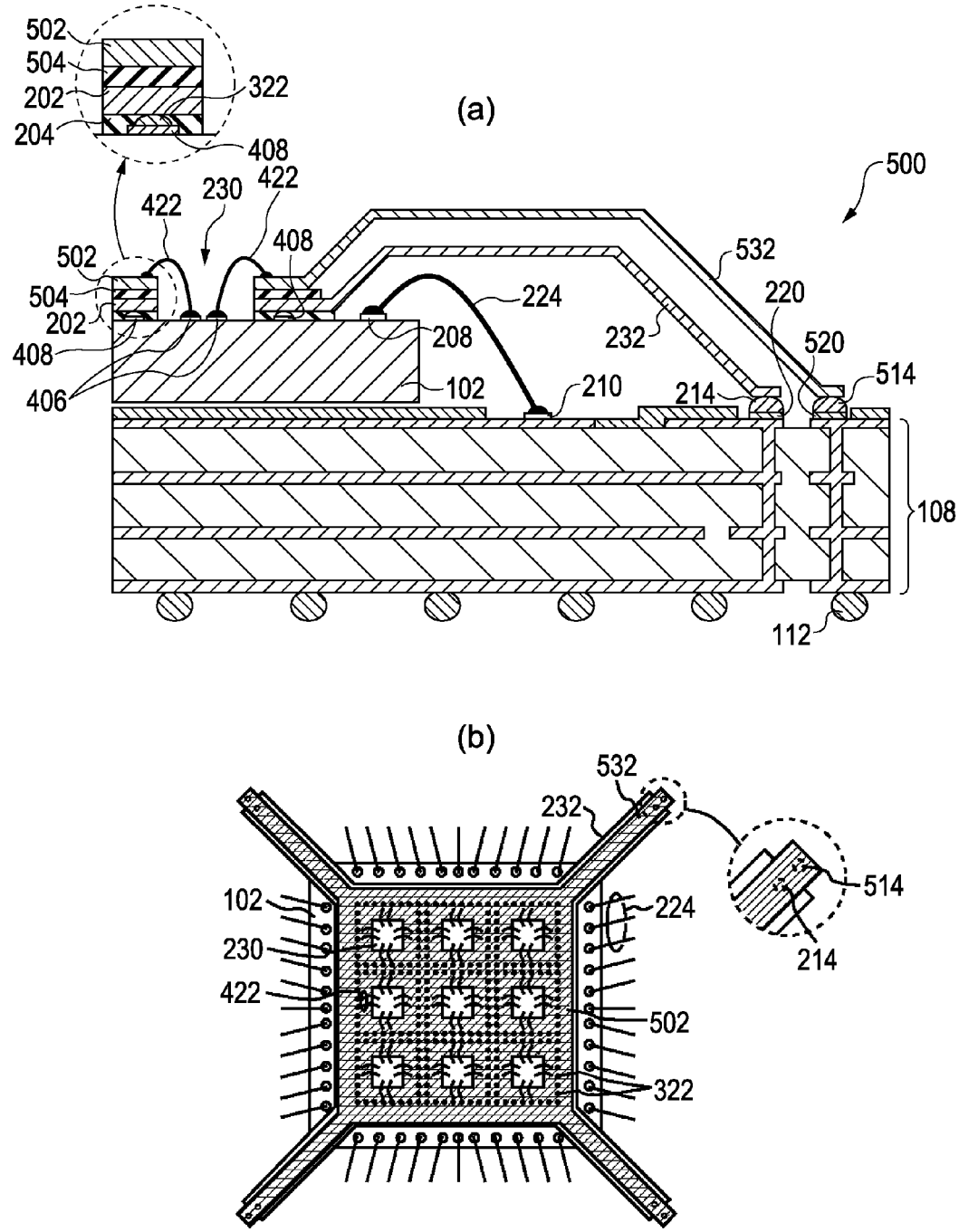
FIG. 6 are schematic views of a semiconductor package that includes two conductor plates and uses wire bonding and Au stud bumps in connection to the conductor plates according to an embodiment of the present invention.

FIG. 6 illustrate a semiconductor package 500 which uses two conductor plates and uses wire bonding (for connection to the upper conductor plate) and Au stud bumps (for connection to the lower conductor plate) in connection to the central electrode pads on the semiconductor chip according to still another embodiment of the present invention. The semiconductor package 500 uses a two-layer conductor-plate structure in which a second insulating layer 504 is disposed on the first conductor plate 202, illustrated in FIGS. 3, and a second conductor plate 502 is disposed on the second insulating layer 504. Each of the two conductor plates has an opening corresponding to the central electrode pads on the chip. Preferably, the conductor plates may have different functions. For example, the first conductor plate 202 is used in power supply voltage wiring, and the second conductor plate 502 is used in ground wiring. Preferably, the insulating layer 204 may be formed by an ACF or nonconductive paste, and the second insulating layer 504 may be formed by a nonconductive film or nonconductive paste.

As illustrated in FIG. 6(a), the central electrode pads 406 and 408 are disposed on the upper surface of the chip 102 exposed through the opening 230 and disposed around and outer periphery of the opening 230, respectively. Examples of the central electrode pads include the power supply voltage (VDD) pads 406 and the ground (GND) pads 408. The central electrode pads 406 are bonded to the second conductor plate 502, which is the upper layer, with the Au wires 422. The central electrode pads 408 are connected to the first conductor plate 202, which is the lower layer, with the Au stud bumps 322. The peripheral electrode pads 208 are typically bonded to the conductive wiring pads 210 for use in signal lines and other purposes on the upper surface of the interposer substrate 108 with the Au wires 224. The extraction portions 232 extend from the four corners of the first conductor plate 202, and extraction portions 532 extend from the four corners of the second conductor plate 502. The extraction portions 232 and 532 are connected to the power-supply or ground wiring pads 220 and 520 with the solder (or conductive paste) 214 and 514, respectively. FIG. 6(b) illustrates a structure in which the extraction portions 232 and 532 are down set so as to have different heights and overlap each other in plan view. However, the extraction portions can be arranged so as not to overlap each other in plan view. The semiconductor package 500 according to the embodiment illustrated in FIG. 6 may have a basic structure in which each of the conductor plates has a single opening and a single extraction portion.

The size and shape of the opening of each of the conductor plates and the insulating layers may be set depending on arrangement of the central electrode pads on the semiconductor chip, the power supply voltage pads, and the ground pads. Preferably, the opening of each of the insulating layer 204, the first conductor plate 202, the second insulating layer 504, and the second conductor plate 502 may be designed so as to improve insulation properties and facilitate alignment by, for example, increasing the size of the opening in an upward direction (e.g., the size of the opening increases stepwise in the upward direction). Where feasible, a mark for alignment may be patterned. The arrangement of the openings may be, but not limited to, symmetrical, such as a grid structure, to enable power to be uniformly supplied from the power-supply/ground wiring.

FIGS. 7A and 7B illustrate a method for fabricating a semiconductor package that includes a conductor plate according to an aspect of the present invention. Process blocks (a), (b), (c), and (d) correspond to steps for fabricating a semiconductor package illustrated in FIG. 2, that in FIG. 3 (or FIG. 4), that in FIG. 5, and FIG. 6, respectively. The blocks (a) and (b) illustrate steps for forming a single conductor plate on the semiconductor chip, whereas the blocks (c) and (d) illustrate steps for forming two conductor plates on the semiconductor chip. The blocks (a) and (c) illustrate a process for wire-bonding a first conductor plate to a corresponding central electrode pad on the semiconductor chip, whereas the blocks (b) and (d) illustrate a process for connecting the first conductor plate to the corresponding central electrode pad on the semiconductor chip with a Au stud bump. It is to be noted that a conductor plate structure composed of three or more layers can be formed by repetition of similar steps.

As illustrated in FIGS. 7A and 7B, in steps 602 to 606, a semiconductor chip is prepared, and is joined to an interposer substrate. In step 602, the back of a semiconductor wafer that has a plurality of semiconductor chips is grinded (or polished). Here, each of the semiconductor chips has a plurality of central electrode pads at the central portion of the chip to receive power (current voltage) supplied from the interposer substrate and also has peripheral electrode pads connected to conductive wiring pads on the interposer substrate and disposed at the periphery of the chip. The central electrode pads are pads for connection to the power supply or to the ground or to both and are arranged on the upper surface of the chip in accordance with circuit design. In step 604, the semiconductor wafer is cut into chips by dicing. In step 606, a chip is bonded to the interposer substrate. In step 606, the chip is bonded to the interposer substrate by soldering of BGA solder balls on the back of the chip to the interposer substrate.

The block (a) illustrates a process using a single conductor plate illustrated in FIG. 2 for connecting the conductor plate to the central electrode pads on the chip by wire-bonding. First, in step 612, a nonconductive film is bonded to or nonconductive paste is applied to the chip to form an insulating layer that has an opening. In step 614, conductive paste or solder is applied to the wiring pads on the interposer substrate. Then, in step 615, the conductor plate is placed on, here bonded to, the insulating layer. It is preferable that the conductor plate be bonded to the insulating layer in order to be fixed, but it is not necessarily required (the same applies to the process blocks (b), (c), and (d) described below). The conductor plate is made of copper and has a thickness of approximately 20 μm to 200 μm, and has an opening used for wire-bonding to the electrodes at the central portion of the chip and an extraction portion used for connection to the interposer substrate. Subsequently, the central electrodes on the chip and the conductor plate are bonded together with gold wires. In step 616, the peripheral electrode pads on the chip and the conductive wiring pads on the interposer substrate are bonded together with gold wires. After the conductor plate is placed, the extraction portion is connected to a power-supply wiring pad on the interposer substrate using the conductive paste or solder applied in the previous step (S614). Although the description is not repeated in the process blocks (b), (c), and (d) described below, by processing the conductive paste or solder in a normal way after the conductor plate is placed, each extraction portion of each conductor plate is connected to a corresponding power-supply wiring pad on the interposer substrate, similarly to the above.

The block (b) illustrates a process using a single conductor plate illustrated in FIG. 3 or 4 for connecting the conductor plate to the central electrode pads on the chip by using Au stud bumps. First, in step 621, Au stud bumps are formed on the chip. Then, in step 622, an ACF is bonded to or nonconductive paste is applied to the chip to form an insulating layer that has an opening. In step 624, conductive paste or solder is applied to the power-supply wiring pads on the interposer substrate. Then, in step 625, the conductor plate is placed on the insulating layer and bonded thereto. At this time, in the case of the ACF, through the application of heat and pressure, electric connections are established between the central electrodes on the chip and the conductor plate via the Au stud bumps, while at the same time insulation properties of the insulating layer except for the central electrodes are maintained (laterally). In the case of the application of the nonconductive paste, preferably, the nonconductive paste attached to the surfaces of the Au stud bumps may be removed before the conductor plate is bonded. In this structure, there is no need to wire-bond the electrodes at the central portion of the chip. Therefore, although the conductor plate illustrated in FIG. 3 has an opening, the conductor plate may have no opening (see FIG. 4). Subsequently, in step 626, the peripheral electrode pads on the chip and the conductive wiring pads on the interposer substrate are bonded together with gold wires.

The block (c) illustrates a process using two conductor plates illustrated in FIG. 5 for connecting each conductor plate to the respective central electrode pads on the chip by wire-bonding. First, in step 632, a nonconductive film is bonded to or nonconductive paste is applied to the chip to form an insulating layer that has an opening. In step 634, conductive paste or solder is applied to the power-supply wiring pads on the interposer substrate. Then, in step 635, the first conductor plate is placed on and bonded to the insulating layer. Subsequently, in step 636, a nonconductive film is bonded to or nonconductive paste is applied to the first conductor plate to form a second insulating layer. Then, in step 637, the second conductor plate is positioned on the second insulating layer and bonded thereto. At this time, an opening is formed in each layer so as to expose the surface of the first conductor plate in the opening. In step 638, the central electrode pads on the chip and the first conductor plate are bonded together with gold wires, and the peripheral electrode pads on the chip and the conductive wiring pads on the interposer substrate are bonded together with gold wires.

The block (d) illustrates a process using two conductor plates illustrated in FIG. 6 for connecting a first conductor plate to corresponding central electrode pads with Au stud bumps, and connecting a second conductor plate to corresponding central electrode pads by wire-bonding. First, in step 641, Au stud bumps are formed on the central electrode pads on the chip. Then, in step 642, an ACF is bonded to or nonconductive paste is applied to the chip to form an insulating layer that has an opening so as to cover at least part of the upper surface of the chip. In step 644, conductive paste or solder is applied to the power-supply wiring pads on the interposer substrate. Then, in step 645, the first conductor plate is placed on the insulating layer and bonded thereto. When an ACF is used in the insulating layer, the first conductor plate is positioned, and, through the application of heat and pressure, electric connections are established between the central electrodes on the chip and the first conductor plate via the Au stud bumps, while at the same time insulation properties are maintained (laterally). When the insulating layer is formed by the application of the nonconductive paste, the nonconductive paste attached to the surfaces of the Au stud bumps are removed before the first conductor plate is bonded. In this two-layer conductor-plate structure, in order to connect the second conductor plate to corresponding central electrodes, the first conductor plate having the opening is used. Subsequently, in step 646, a nonconductive film is bonded to or nonconductive paste is applied to the first conductor plate to form a second insulating layer. Then, in step 647, the second conductor plate is positioned on the second insulating layer and bonded thereto. Finally, in step 648, the central electrode pads on the chip and the second conductor plate are bonded together with gold wires through the opening, and the peripheral electrode pads on the chip and the conductive wiring pads on the interposer substrate are bonded together with gold wires.

In step 650, the structure formed by the process blocks (a), (b), (c), and (d) illustrated in FIGS. 7A and 7B, i.e., the semiconductor chip and the bonding wires are covered and sealed using molding resin. For example, a sealant that can be used for packaging of an organic substrate having a high glass transition temperature and suppress the amount of curling can be used. Preferably, the sealant may be of a type that supports fine-pitch wire bonding. In the process blocks described above, typically, each of the insulating layer, the first conductor plate, the second insulating layer, and the second conductor plate is bonded after an opening is aligned with a position corresponding to the central electrode pads on the chip.

Figure 8:
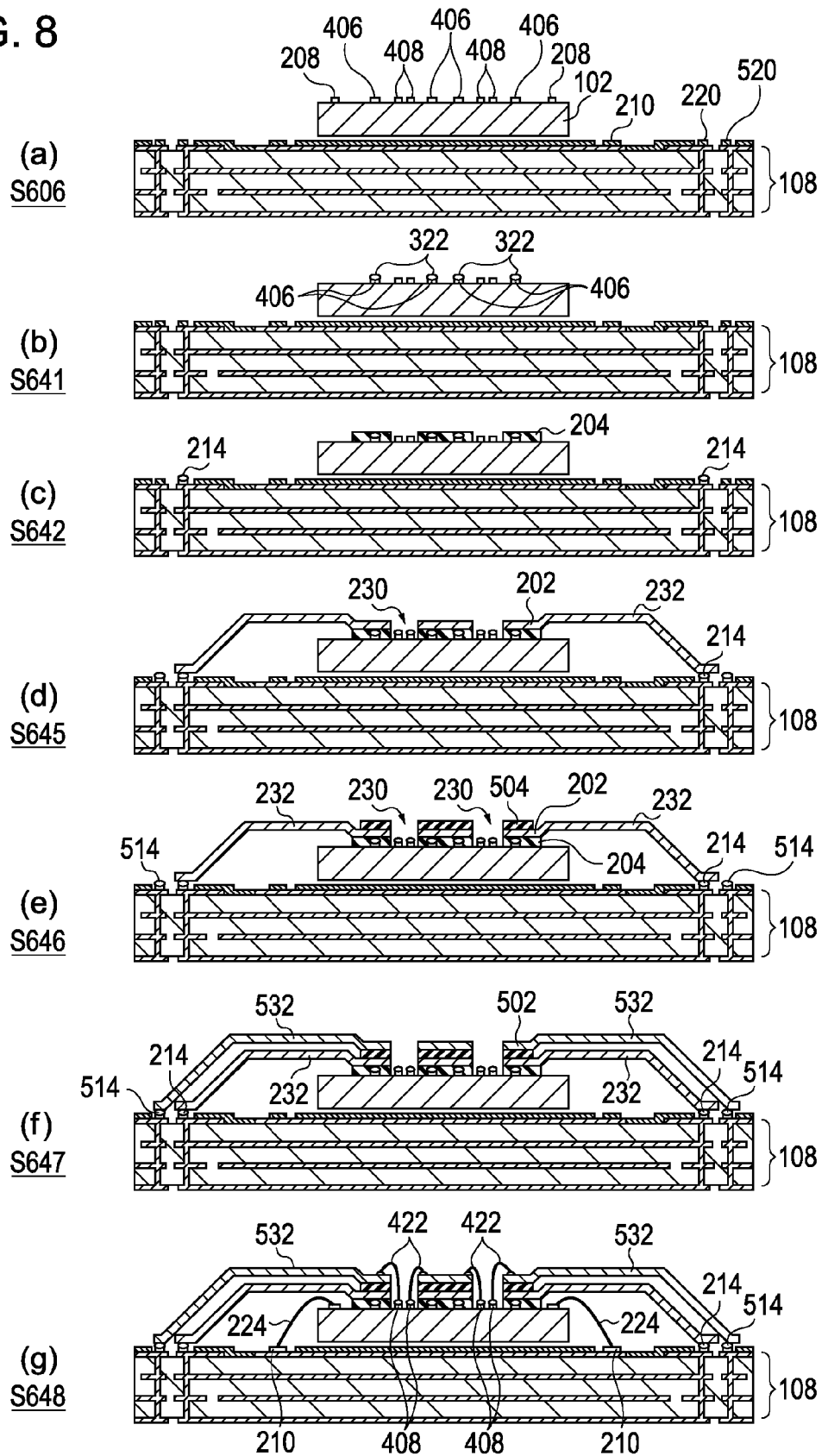
FIG. 8 illustrate structures in stages in a process for forming two conductor plates illustrated in FIG. 6.

FIG. 8 illustrate steps for fabricating a semiconductor package structure illustrated in FIG. 6 formed in the process block (d) in FIG. 7. FIGS. 8(a) to 8(g) illustrate intermediate structures corresponding to the steps. Here, the first conductor plate is used in power-supply wiring, and the second conductor plate is used in ground wiring. However, usage of the first conductor plate and that of the second conductor plate can be interchanged. Alternatively, power-supply wiring and ground wiring can be assigned in different regions of each of the conductor plates. FIG. 8(a) illustrates step 606, where the semiconductor chip 102 is joined to the interposer substrate 108. Here, the central electrode pads 406 (for connection to the first conductor plate, for the power-supply wiring), the central electrode pads 408 (for connection to the second conductor plate, for the ground wiring), and the peripheral electrode pads 208 have been previously formed on the semiconductor chip 102 in accordance with circuit design. The power-supply wiring pads 220, the ground wiring pads 520, and the conductive wiring pads 210 have been previously formed on the interposer substrate 108 in advance. FIG. 8(b) illustrates step 641, where the Au stud bump 322 is formed on each of the central electrode pads 406 on the chip 102. FIG. 8(c) illustrates step 642, where nonconductive paste is applied to or an ACF is bonded to the chip 102, thereby forming the insulating layer 204 having the openings 230. Additionally, the solder (or conductive paste) 214 is applied to the power-supply wiring pads 220 on the interposer substrate 108. FIG. 8(d) illustrates step 645, where the first conductor plate 202 having the extraction portions 232 is positioned on the insulating layer 204, the first conductor plate 202 and the central electrode pads 406 are connected together with the Au stud bumps 322, and the extraction portions 232 are connected to the power-supply wiring pads 220 on the interposer substrate 108 via the solder (or conductive paste) 214. When an ACF is used in the insulating layer 204 and is used as an alternative to the solder (or conductive paste) 214, by thermocompression bonding with heat, both connection between the first conductor plate 202 and the central electrode pads 406 and connection between the power-supply wiring pads 220 and the extraction portions 232 can be established at a time. FIG. 8(e) illustrates step 646, where the second insulating layer 504 having the openings is formed by application of the nonconductive paste or bonding of the nonconductive film to the first conductor plate 202. At this time, the solder (or conductive paste) 514 is applied to the ground wiring pads 520 on the interposer substrate 108. FIG. 8(f) illustrates step 647, where the second conductor plate 502 having the extraction portions 532 is positioned on the second insulating layer 504 and is then bonded thereto. Additionally, the extraction portions 532 are connected to the respective ground wiring pads 520 on the interposer substrate 108 through the solder (or conductive paste) 514. FIG. 8(g) illustrates step 648, where the second conductor plate 502 is bonded to the central electrode pads 408 on the chip 102 with the Au wires 422, and the peripheral electrode pads 208 on the chip 102 are bonded to the conductive wiring pads 210 on the interposer substrate 108 with the Au wires 224.

The semiconductor package structure completed through the process illustrated in FIG. 8 is a structure in which two conductor plates illustrated in FIG. 6 are connected to corresponding central electrode pads on the chip by wire bonding (for the second conductor plate 502) and by using Au stud bumps (for the first conductor plate 202). As illustrated in FIG. 6, the extraction portions 232 and 532 symmetrically extend from the four corners of the rectangular chip 102. However, the extraction portions 232 and 532 are not limited to a structure illustrated in FIG. 6. For example, the extraction portions 232 and 532 can extend from one or two corners. Alternatively, the extraction portions 232 and 532 can extend from any appropriate place of the four (or one or two) sides of the chip.

FIG. 9 illustrate a semiconductor package 800 which includes two conductor plates using an integrated multilayer plate (including a three-layer plate or film composed of layers having functions, e.g., conductive-layer/insulating-layer/conductive-layer) according to still another embodiment of the present invention. The multilayer plate is typically a flexible plate or a flexible film. The semiconductor package 800 is similar to the semiconductor package 400, which is illustrated in FIG. 5. FIG. 9(a) is a cross-sectional view of the semiconductor package 800. FIG. 9(b) is a plan view thereof. FIG. 9(c) illustrates a detailed cross-sectional view of the multilayer plate. A three-layer flexible plate 810 has a stepped opening 830 such that at least part of each of conductive layers 802 and 806 is exposed. Therefore, unlike the embodiments illustrated in FIGS. 2 to 6, it is not necessary to downset extraction portions 860 in advance. Freely curving the flexible plate enables connection to the interposer substrate 108. The flexible plate 810 can be positioned on the insulating layer 204 having the openings and being formed on the semiconductor chip 102 and be bonded thereto. Exposed surfaces (upper surfaces) of the conductive layers 802 and 806, which are lower and upper layers of the three-layer flexible plate 810 (with the extraction portions 860), respectively, are bonded to the central electrode pads 408 and 406 with Au wires 844 and 842, respectively. The (lower and upper) conductive layers exposed as the lower surface of the extraction portions 860 of the three-layer flexible plate 810 can be connected to pads 822 and 824 on the interposer substrate 108, respectively, through solder (or conductive paste) 840. For the sake of simplicity, in FIG. 9(b), bonding wires at the openings are omitted. The semiconductor chip 102 and the insulating layer 204 can have the same structure as in FIGS. 5 and 6. More specifically, FIG. 9 illustrates a structure in which the lower and upper conductor plates 802 and 806 are both connected to the central electrode pads on the chip by wire bonding, which is similar to that illustrated in FIG. 5. However, the present embodiment is applicable to a structure in which the lower conductor plate 802 is connected to the central electrode pads with Au stud bumps, which is similar to that illustrated in FIG. 6. In this case, the openings 830 of the lower conductor plate 802, an insulating layer 804, and the upper conductor plate 806 can be flush with (or coplanar with) each other in cross section, i.e., can have the same size. Preferably, a portion of the lower surface of the lower conductor plate that is in contact with a Au stud bump (corresponding to 322 in FIG. 6) may be exposed.

The semiconductor package 800 can use the multilayer plate 810, in which the lower conductor plate 802, the insulating layer 804, and the upper conductor plate 806 are integrally formed as minimum configuration, as a flat power-supply wiring line (so-called stripline), which features small power losses to the semiconductor chip. For example, the upper conductor plate is used in power-supply wiring, and the lower conductor plate is used in ground wiring. A general flexible film or flexible substrate, for example, a double-sided flexible plastic substrate that has copper-foil at its both sides, can be used as the three-layer structure. The lower conductor plate 802 can be connected using Au stud bumps formed on the chip, as illustrated in FIG. 6. The flexible substrate can have, for example, an insulator composed of a polyimide film having a thickness of 30 µm to 150 µm and copper foil layers each having a thickness of approximately 20 µm to 150 µm on both sides of the insulator. The shape of the flexible substrate can be repeatedly deformed or changed with a small force. Even when the shape is deformed, electric characteristics can be maintained.

The peripheral electrode pads 208 at the peripheral of the chip are typically bonded to the conductive wiring pads 210 for use in signal lines or other purposes on the upper surface of the interposer substrate 108 with Au wires. As illustrated in FIG. 9(b), the multilayer plate 810 has the extraction portions 860 at the four corners. Among the wiring pads on the interposer substrate 108, the ground (GND) pads 822 and the power-supply voltage (VDD) pads 824 can be connected to the lower conductor plate 802 and the upper conductor plate 806, respectively, with the solder (or conductive paste) 840. This solder (or conductive paste) can be replaced with an ACF. The ACF may be previously formed on the multilayer plate. In the structure illustrated in FIG. 9, the connection surface of the upper conductor plate 806 can be obtained by grinding or etching the end of each of the extraction portions of the multilayer plate. In FIG. 9, the extraction portions 860 symmetrically extend from the four corners of the rectangular chip 102. However, the extraction portions 860 are not limited to this structure. For example, the extraction portions 860 may extend from two corners or the extraction portions 860 may be replaced with an extraction portion extending from one corner.

As illustrated in FIG. 9(c), the integrated multilayer plate (also called a three-layer flexible plate in terms of functionality) 810 is a flexible plate in which the extraction portions 860 are also integrally formed. The basic structure has three layers (conductive-layer/insulator/conductive-layer) consisting of a base film 880 composed of an insulator and conductive layers 882 and 884 made of copper foil disposed above and below the base film 880. Preferably, the integrated multilayer plate 810 may also include a surface treatment layer 888 (e.g., plating) on an electric connection portion of each of the conductive layers 882 and 884. The integrated multilayer plate 810 may include a cover film 886 for protecting each of the conductive layers 882 and 884, and a reinforcing film 890 for reinforcing the entire structure. The reinforcing film 890 may be formed on the upper cover film 886 in the structure illustrated in FIG. 9(c). For electric connection, the opening 830 may be formed such that at least part of the surface treatment layer 888 plated on the conductive layer 882 or 884 is exposed.

The multilayer plate may have a structure that provides the semiconductor chip with an external capacitor. More specifically, the lower conductor plate 802 and the upper conductor plate 806 of the three-layer flexible plate 810 are subjected to patterning, and a region where upper and lower copper patterns above and below the insulating layer 804 overlap each other is formed. By changing the area of the overlapping region, the material of the insulating layer 804 (i.e., dielectric constant), or the thickness, a capacitor can be incorporated into circuit design in the chip. The provision of the appropriate opening 830 to the three-layer plate 810 adjacent to the circuit wiring pads in the chip enables the circuit wiring pads in the chip to be bonded to upper and lower conductor plate portions of the capacitor formed by patterning to the three-layer plate 810 using gold wires.

Examples of comparison of voltage drops on a semiconductor chip that uses a conductor plate according to an aspect of the present invention are described below. In the examples, a PGBA semiconductor package of 27 mm square having an upper surface on which a semiconductor chip is mountable is used, and a conductor plate that uses copper having a thickness of 35 µm is used. A Au wire having a diameter of 25 µm is used in wire-bonding connection between a peripheral electrode pad of an 8.8 mm square semiconductor chip and a wiring substrate. Power consumption of the chip measures 5 W. When a power supply voltage 1V is applied to the chip, the distribution of voltage drop on the chip in the semiconductor package divided in four portions is compared by calculation.

COMPARATIVE EXAMPLE 1

FIG. 10 illustrate voltage drops occurring when high-density short wires are used in wire bonding connection at the periphery of the chip. FIG. 10(a) illustrates voltage drops on the chip when a conductor plate is not used. FIG. 10(b) illustrates voltage drops on the chip when a conductor plate is used, high-density Au wires having a length of 1.5 mm are used in connection at the periphery of the chip, and Au stud bumps are used in the central portion of the conductor plate, i.e., the outer periphery of the opening. The result shows that, at the central portion of the chip, where the voltage drop is maximum, the voltage drop occurring when a conductor plate is used can be reduced to approximately one-third of that occurring when a conductor plate is not used, and variations in voltage drop can also be suppressed.

COMPARATIVE EXAMPLE 2

Figure 11:
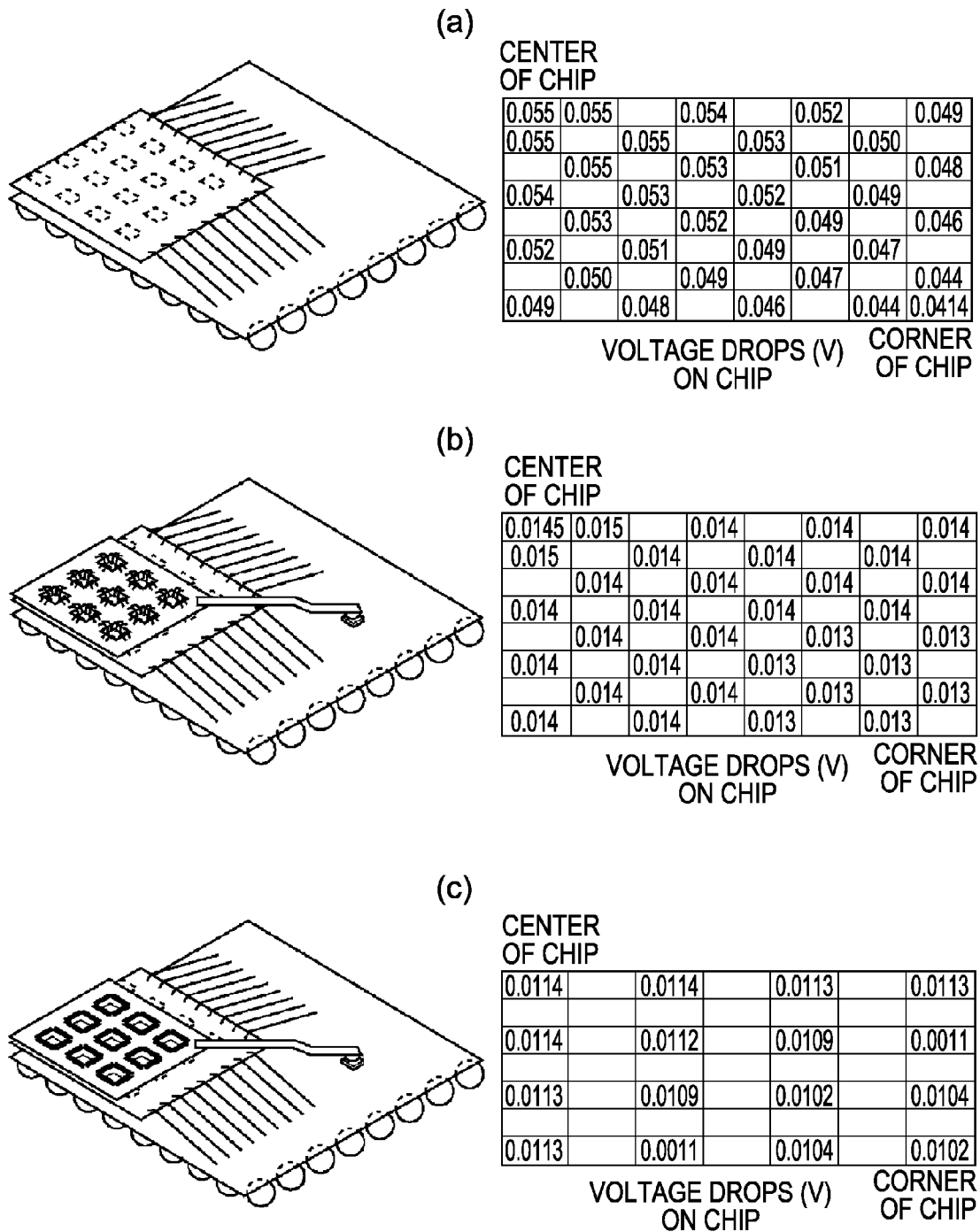
FIG. 11 illustrate voltage drops at the central portion of a chip occurring when low-density long wires are used in wire bonding connection at the periphery of the chip for a structure that includes no conductor plate in FIG. 11(a), a structure that uses wire bonding connection in an opening of the conductor plate in FIG. 11(b), and a structure that uses Au stud bump connection in FIG. 11(c).

FIG. 11 illustrate voltage drops occurring when low-density long wires are used in wire bonding connection at the periphery of the chip. FIG. 11(a) illustrates voltage drops on the chip when a conductor plate is not used. FIG. 11(b) illustrates voltage drops on the chip when a conductor plate is used, low-density Au wires having a length of 2.0 mm are used in connection at the periphery of the chip, and Au stud bumps are used in the central portion of the conductor plate, i.e., the outer periphery of the opening. The result shows that, at the central portion of the chip, the voltage drop occurring when a conductor plate is used can be reduced to approximately one-fourth of that occurring when a conductor plate is not used, and variations in voltage drop can also be suppressed. FIG. 11(c) illustrates voltage drops occurring when Au stud bump connection is used in the periphery of the opening. For this case of Au stud bump connection, the result shows that, at the central portion of the chip, the voltage drop in this case can be reduced to approximately one-fifth of that occurring when a conductor plate is not used. That is, when the density of bonding wires at the periphery of the chip is low, the advantageous effect of suppressing the voltage drop is increased. This shows effectiveness of a conductor plate.

Figure 12:
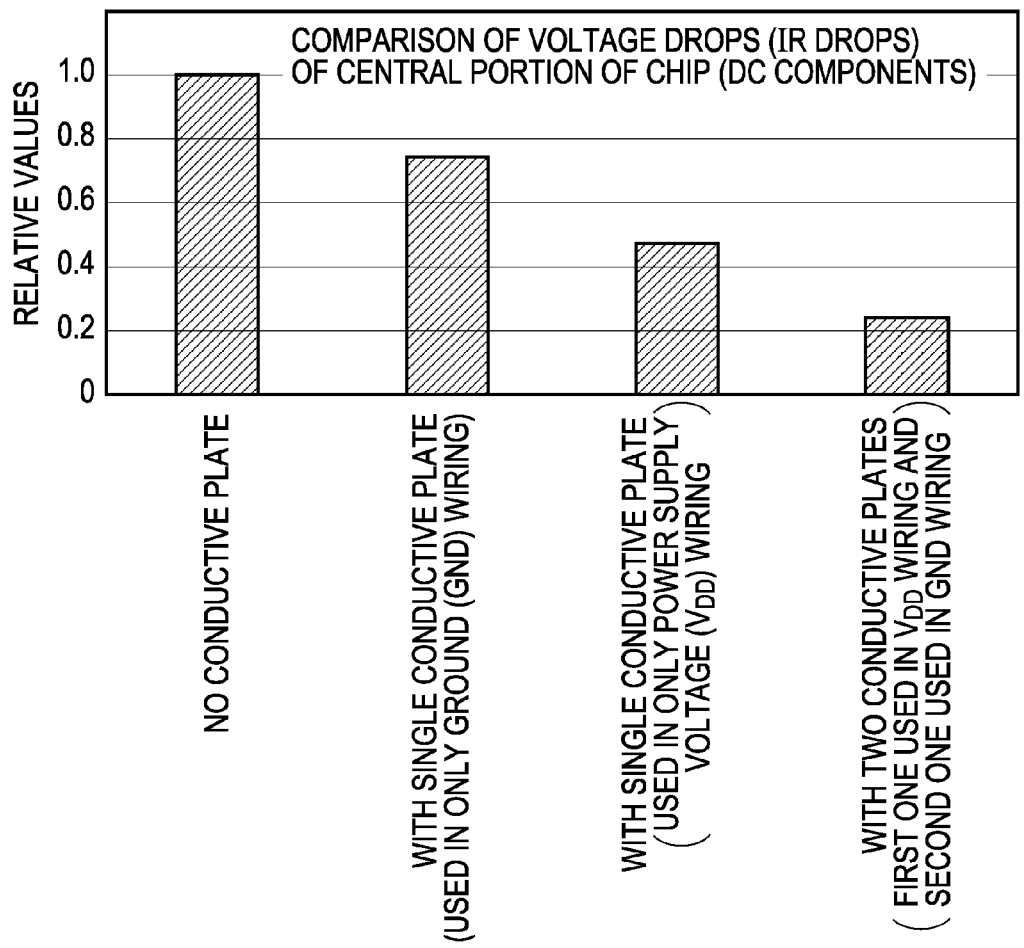
FIG. 12 illustrates comparative examples of voltage drop at the central portion of a chip occurring when a conductor plate is used in power supply voltage wiring or ground wiring or both.
Figure 13:
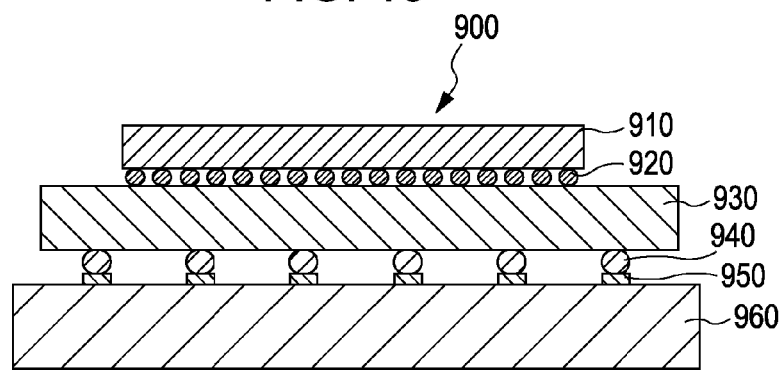
FIG. 13 illustrates an example of a known semiconductor package.

FIG. 12 illustrates an example of comparison of voltage drops (DC components) at the central portion of a semiconductor chip for different numbers of conductor plates used in power supply voltage (VDD) wiring or ground (GND) wiring or both. Comparisons are performed among when a single conductor plate is used in ground wiring, when a single conductor plate is used in power supply voltage wiring, and when two conductor plates are used such that one is used in ground wiring and the other is used in power supply voltage wiring. The results show that, for a single conductor plate, the voltage drop is smaller when the conductor plate is used in power supply voltage wiring and, for two conductor plates, the voltage drop can be reduced to approximately one-third or one-half of that occurring when the single conductor plate is used in only ground wiring or power supply voltage wiring, respectively, and can be reduced to approximately one-fifth of that occurring when the conductor plate is not used.

According to the embodiments of the present invention, in addition to reduction in voltage drop at the central portion of the chip, power-supply/ground wiring can be directly provided to the central portion of the chip. Therefore, the number of connection pads for power-supply/ground at the periphery of the chip can be reduced, and design that assigns pads obtained by this reduction to pads for use in signal lines can be made. That is, in design of the periphery of a chip, multiple pins supporting an increased number of signal pads can be facilitated. In addition, in a BGA semiconductor package, the power-supply/ground wiring on a chip can be directly connected to power-supply wiring pads on an interposer substrate, and the interposer substrate can be directly connected to an external circuit through solder balls or other members. Therefore, loop inductance can be reduced.

Although the present invention has been described in accordance with the particular embodiments shown with reference to the drawings, the technical scope of the present invention is not limited to the disclosed embodiments. One of ordinary skill in the art will readily recognize that there could be variations to the embodiments and those variations would be within the spirit and scope of the present invention. Therefore, it is, of course, understood that the variations and improvements to the embodiments are included in the technical scope of the present invention.

The invention claimed is:

1. A semiconductor package comprising:
   a wiring substrate having a power-supply wiring pad;
   a semiconductor chip disposed on the wiring substrate and having a plurality of peripheral electrode pads and at least one central electrode pad on a principal surface thereof, the plurality of peripheral electrode pads being connected to the wiring substrate, the central electrode pad being disposed so as to be surrounded by the peripheral electrode pads and receiving power supplied from the wiring substrate;
   at least one conductor disposed on the semiconductor chip and electrically connected to the central electrode pad, the conductor having at least one extraction portion connected to the power-supply wiring pad of the wiring substrate;
   an insulating layer, wherein the conductor is a conductor plate, and the conductor plate is disposed on the semiconductor chip such that the insulating layer is disposed therebetween;
   a second insulating layer disposed on the conductor plate; and
   a second conductor plate disposed on the second insulating layer and having at least one second extraction portion connected to a second power-supply wiring pad of the wiring substrate, the second power-supply wiring pad different than the first power-supply wiring pad.

2. The semiconductor package according to claim 1, wherein the plurality of peripheral electrode pads are electrically connected to the wiring substrate using bonding wires.

3. The semiconductor package according to claim 1, wherein the insulating layer comprises a nonconductive film or nonconductive paste.

4. The semiconductor package according to claim 1, wherein the wiring substrate is a ball grid array (BGA) substrate constituting an interposer substrate connected to an external circuit.

5. The semiconductor package according to claim 1, wherein the conductor plate is used in either ground wiring or power-supply wiring or both.

6. The semiconductor package according to claim 1, wherein the conductor plate is made of a metal and is subjected to surface treatment of metal plating.

7. The semiconductor package according to claim 1, wherein the second conductor plate is electrically connected to a second central electrode pad on the semiconductor chip, wherein the second central electrode pad is different than the central electrode pad, and the second conductor plate is used in either ground wiring or power-supply wiring or both.

8. The semiconductor package according to claim 1, wherein the conductor plate and the insulating layer have at least one opening at a position corresponding to the central electrode pad, and the conductor plate is electrically connected to the central electrode pad through the opening using a bonding wire.

9. The semiconductor package according to claim 8, wherein the at least one opening comprises a plurality of openings arranged in a grid.

10. The semiconductor package according to claim 1, wherein the conductor plate, the second insulating layer, and the second conductor plate are integrally formed into a multilayer plate, and each of the conductor plate and the second conductor plate is used in power-supply wiring or ground wiring.

11. The semiconductor package according to claim 10, wherein the multilayer plate has at least one extraction portion and an opening corresponding to the central electrode pad, and a surface of the conductor plate is exposed in accordance with an arrangement of the central electrode pad.

* * * * *